(12) United States Patent
Zhang et al.

(10) Patent No.: US 12,499,840 B2
(45) Date of Patent: Dec. 16, 2025

(54) ORGANIC LIGHT EMITTING DIODE (OLED) DISPLAY SUBSTRATE INCREASING PIXEL DENSITY BY SLIGHTLY CHANGING SIZE OF PIXEL CIRCUIT, DISPLAY PANEL, AND DISPLAY DEVICE

(71) Applicant: BOE TECHNOLOGY GROUP CO., LTD., Beijing (CN)

(72) Inventors: Chenyang Zhang, Beijing (CN); Zhenyu Zhang, Beijing (CN); Hongrun Wang, Beijing (CN); Haixu Li, Beijing (CN); Fuqiang Li, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 361 days.

(21) Appl. No.: 17/997,125

(22) PCT Filed: Oct. 29, 2021

(86) PCT No.: PCT/CN2021/127487
§ 371 (c)(1),
(2) Date: Oct. 25, 2022

(87) PCT Pub. No.: WO2023/070537
PCT Pub. Date: May 4, 2023

(65) Prior Publication Data
US 2024/0395212 A1 Nov. 28, 2024

(51) Int. Cl.
*G09G 3/32* (2016.01)
*G09G 3/3258* (2016.01)
(Continued)

(52) U.S. Cl.
CPC ............ *G09G 3/3258* (2013.01); *G09G 3/32* (2013.01); *H10K 59/1213* (2023.02);
(Continued)

(58) Field of Classification Search
CPC .......... G09G 3/30; G09G 3/32; G09G 3/3208; G09G 3/3216; G09G 3/3225;
(Continued)

(56) References Cited

U.S. PATENT DOCUMENTS 8,698,969 B2   4/2014   Tsubata
11,195,897 B2  12/2021  Wang et al.
(Continued)

FOREIGN PATENT DOCUMENTS

CN   109065592 A   12/2018
CN   109860259 A    6/2019
(Continued)

OTHER PUBLICATIONS

International Search Report and Written Opinion dated Jul. 27, 2022, for corresponding PCT Application No. PCT/CN2021/127487.

*Primary Examiner* — Ke Xiao
*Assistant Examiner* — Nelson Lam
(74) *Attorney, Agent, or Firm* — Kinney & Lange, P.A.

(57) ABSTRACT

A display substrate includes a plurality of pixel circuits arranged in an array and a plurality of light emitting devices provided on a substrate, and at least one pixel circuit is connected to a corresponding light emitting device through a conductive structure. At least some of the pixel circuits in at least one column include a first pixel circuit and a second pixel circuit arranged on a side of the first pixel circuit away from the substrate, orthographic projections of the second pixel circuit and the first pixel circuit on the substrate partially overlap to form an overlapping portion defining a first pattern, and an orthographic projection of a conductive structure of the first pixel circuit on the substrate, the first pattern, and an orthographic projection of a conductive (Continued)

structure of the second pixel circuit on the substrate are sequentially arranged in a first direction.

20 Claims, 14 Drawing Sheets

(51) Int. Cl.
*H10K 59/121* (2023.01)
*H10K 59/123* (2023.01)
*H10K 59/131* (2023.01)
*H10K 59/35* (2023.01)

(52) U.S. Cl.
CPC ......... *H10K 59/123* (2023.02); *H10K 59/131* (2023.02); *H10K 59/351* (2023.02); *G09G 2300/0426* (2013.01); *G09G 2300/0443* (2013.01); *G09G 2300/0452* (2013.01); *G09G 2300/0465* (2013.01); *G09G 2300/0819* (2013.01); *G09G 2300/0861* (2013.01); *G09G 2310/08* (2013.01); *G09G 2320/045* (2013.01)

(58) Field of Classification Search
CPC .... G09G 3/3233; G09G 3/3241; G09G 3/325; G09G 3/3258; G09G 3/3266; G09G 3/3275; G09G 3/3283; G09G 3/3291; G09G 2300/0443; G09G 2300/0452; H10K 59/35; H10K 59/351; H10K 59/352; H10K 59/353
USPC ....................................................... 345/76–83
See application file for complete search history.

(56) References Cited

U.S. PATENT DOCUMENTS

| | | | |
|---|---|---|---|
| 11,367,396 B2 | 6/2022 | Li et al. | |
| 11,468,840 B2 | 10/2022 | Dong et al. | |
| 11,532,274 B2 | 12/2022 | Dong et al. | |
| 11,620,951 B2 | 4/2023 | Dong et al. | |
| 2010/0315318 A1* | 12/2010 | Lee ........................ | H10D 86/00 345/76 |
| 2011/0109654 A1* | 5/2011 | Van Veenendaal ........................ | G02F 1/133305 427/162 |
| 2012/0026415 A1 | 2/2012 | Tsubata | |
| 2014/0184669 A1* | 7/2014 | Oh ........................ | H10K 59/10 345/82 |
| 2015/0228223 A1* | 8/2015 | Park ..................... | H10K 59/353 345/77 |
| 2015/0294620 A1* | 10/2015 | Cho ..................... | G09G 3/3233 345/77 |
| 2020/0043949 A1 | 2/2020 | Lee et al. | |
| 2021/0126075 A1* | 4/2021 | Wang ................. | H10K 59/1213 |
| 2021/0174744 A1 | 6/2021 | Li et al. | |
| 2021/0183313 A1 | 6/2021 | Dong et al. | |
| 2021/0350748 A1 | 11/2021 | Dong et al. | |
| 2022/0102459 A1 | 3/2022 | Yang et al. | |
| 2022/0310023 A1* | 9/2022 | Shang ..................... | H10D 86/00 |
| 2022/0328007 A1* | 10/2022 | Dong ................. | H10K 59/1213 |
| 2022/0328596 A1 | 10/2022 | Li | |

FOREIGN PATENT DOCUMENTS

| | | |
|---|---|---|
| CN | 110459586 A | 11/2019 |
| CN | 110796961 A | 2/2020 |
| CN | 110993680 A | 4/2020 |
| CN | 111369943 A | 7/2020 |
| CN | 210984240 U | 7/2020 |
| CN | 112017593 A | 12/2020 |
| CN | 112038381 A | 12/2020 |
| CN | 113078174 A | 7/2021 |

* cited by examiner

ORGANIC LIGHT EMITTING DIODE (OLED) DISPLAY SUBSTRATE INCREASING PIXEL DENSITY BY SLIGHTLY CHANGING SIZE OF PIXEL CIRCUIT, DISPLAY PANEL, AND DISPLAY DEVICE

CROSS REFERENCE TO RELATED APPLICATION(S)

This application is a Section 371 National Stage Application of International Application No. PCT/CN2021/127487, filed on Oct. 29, 2021, the whole disclosure of which is incorporated herein by reference in its entirety.

TECHNICAL FIELD

The present disclosure relates to a field of a display technology, and in particular to a display substrate, a display panel and a display device.

BACKGROUND

With a development of the display technology, users have put forward a higher requirement on a pixel density (Pixel Per Inch, PPI) of a display device. In the related art, in order to increase the pixel density of the display device, it is generally needed to reduce a size of a pixel circuit. However, in order to ensure electrical performances of a transistor, a capacitor and the like in the pixel circuit, the size of the pixel circuit may only be reduced to a certain extent. Therefore, it is difficult to achieve a high pixel density.

SUMMARY

The present disclosure provides a display substrate, a display panel, and a display device.

An aspect of the present disclosure provides a display substrate, including: a substrate; and a plurality of pixel circuits and a plurality of light emitting devices provided on the substrate, wherein the plurality of pixel circuits are arranged in an array, and at least one pixel circuit is connected to a corresponding light emitting device through a conductive structure; wherein at least some of the pixel circuits in at least one column include a first pixel circuit and a second pixel circuit; and for at least one group of first pixel circuit and second pixel circuit corresponding to the first pixel circuit: the second pixel circuit is arranged on a side of the first pixel circuit away from the substrate, an orthographic projection of the second pixel circuit on the substrate partially overlaps with an orthographic projection of the first pixel circuit on the substrate so as to form an overlapping portion defining a first pattern, and an orthographic projection of a conductive structure of the first pixel circuit on the substrate, the first pattern, and an orthographic projection of a conductive structure of the second pixel circuit on the substrate are sequentially arranged in a first direction.

According to the embodiments of the present disclosure, the at least one pixel circuit includes an input sub-circuit, a driving sub-circuit and a light-emission control sub-circuit, the input sub-circuit and the light-emission control sub-circuit are connected to the driving sub-circuit, the input sub-circuit is further connected to a scan signal line and a data voltage signal line, and the light-emission control sub-circuit is further connected to a first power line, a light-emission control line and the conductive structure; the input sub-circuit is configured to transmit a data voltage signal of the data voltage signal line to the driving sub-circuit in response to a control of the scan signal line; the light-emission control sub-circuit is configured to transmit a first voltage signal of the first power line to the driving sub-circuit and transmit a driving current provided by the driving sub-circuit to the conductive structure, in response to a control of the light-emission control line; and the driving sub-circuit is configured to provide the driving current according to the data voltage signal and the first voltage signal; and wherein the driving sub-circuit and the light-emission control sub-circuit of at least one first pixel circuit are sequentially arranged in the first direction; the driving sub-circuit and the light-emission control sub-circuit of at least one second pixel circuit are sequentially arranged in a second direction; and the first direction is the same as an extension direction of the data voltage signal line, and the second direction is opposite to the first direction.

According to the embodiments of the present disclosure, the at least one pixel circuit further includes a reset sub-circuit, wherein the reset sub-circuit is connected to the driving sub-circuit, a reference signal line and a reset signal line; wherein the reset sub-circuit is configured to transmit a reference signal of the reference signal line to the driving sub-circuit in response to a control of the reset signal line; and wherein the reset sub-circuit of the at least one pixel circuit is located on a side of the driving sub-circuit away from the light-emission control sub-circuit.

According to the embodiments of the present disclosure, the input sub-circuit of the at least one pixel circuit is located on a side of the light-emission control sub-circuit close to the driving sub-circuit.

According to the embodiments of the present disclosure, the driving sub-circuit includes a driving transistor, the at least one pixel circuit further includes a threshold compensation sub-circuit, the threshold compensation sub-circuit is connected to the scan signal line, a gate electrode and a second electrode of the driving transistor, wherein the threshold compensation sub-circuit is configured to perform a threshold compensation on the driving transistor in response to the control of the scan signal line; and wherein the threshold compensation sub-circuit is located on a side of the light-emission control sub-circuit close to the driving sub-circuit.

According to the embodiments of the present disclosure, the plurality of light emitting devices include light emitting devices of a plurality of colors, wherein for at least one of the plurality of colors, a number of light emitting devices of each color is more than one, and at least some of the light emitting devices of the each color are connected to the first pixel circuit and at least some of the light emitting devices of the each color are connected to the second pixel circuit.

According to the embodiments of the present disclosure, a plurality of pixel units are formed by the plurality of light emitting devices, and at least one pixel unit includes light emitting devices of more than one colors; and wherein in the at least one pixel unit, at least some of light emitting devices are connected to the first pixel circuit, and at least some of light emitting devices are connected to the second pixel circuit.

According to the embodiments of the present disclosure, at least one pixel unit includes a light emitting device of a first color, a light emitting device of a second color, and a plurality of light emitting devices of a third color, and the plurality of light emitting devices of the third color include a first light emitting device and a second light emitting device; wherein in the at least one pixel unit, the light emitting device of the first color is connected to one of the first pixel circuit and the second pixel circuit, and the light emitting device of the second color is connected to the other of the first pixel circuit and the second pixel circuit; and the first light emitting device is connected to one of the first pixel circuit and the second pixel circuit, and the second light emitting device is connected to the other of the first pixel circuit and the second pixel circuit.

According to the embodiments of the present disclosure, the plurality of pixel units are divided into a plurality of columns; wherein in at least one pixel unit in a $(2n-1)^{th}$ column of pixel units, the light emitting device of the first color is connected to the first pixel circuit, the light emitting device of the second color is connected to the second pixel circuit, the first light emitting device is connected to the first pixel circuit, and the second light emitting device is connected to the second pixel circuit; wherein in at least one pixel unit in a $2n^{th}$ column of pixel units, the light emitting device of the first color is connected to the second pixel circuit, the light emitting device of the second color is connected to the first pixel circuit, the first light emitting device is connected to the second pixel circuit, and the second light emitting device is connected to the first pixel circuit; and wherein n is a positive integer.

According to the embodiments of the present disclosure, the first power line extends in the first direction; wherein a plurality of first pixel circuits arranged in a third direction are divided into a plurality of groups, at least one group includes a plurality of first pixel circuits, the plurality of first pixel circuits in the at least one group share one first power line, and the plurality of first pixel circuits in the at least one group are symmetrically arranged with respect to the first power line, wherein the third direction intersects with the first direction; and wherein a plurality of second pixel circuits arranged in the third direction are divided into a plurality of groups, each group includes a plurality of second pixel circuits, the plurality of second pixel circuits in at least one group share one first power line, and the plurality of second pixel circuits in the at least one group are symmetrically arranged with respect to the first power line.

According to the embodiments of the present disclosure, the at least one pixel circuit includes a semiconductor layer, a first gate insulating layer, a first gate layer, an interlayer insulating layer and a first metal layer sequentially arranged in a direction away from the substrate;

and the reset signal line, the scan signal line and the light-emission control line are located in the first gate layer; and wherein the reset signal line, the scan signal line and the light-emission control line connected to the first pixel circuit are sequentially arranged in the first direction, and the reset signal line, the scan signal line and the light-emission control line connected to the second pixel circuit are sequentially arranged in the second direction.

According to the embodiments of the present disclosure, the conductive structure in the first pixel circuit includes a first connection portion and a second connection portion located on a side of the first connection portion away from the substrate, the first connection portion is connected to the light-emission control sub-circuit, and the second connection portion is connected to the light emitting device; wherein the first connection portion is arranged in the same layer as the first metal layer in the second pixel circuit, or the first connection portion is arranged in the same layer as the semiconductor layer in the second pixel circuit.

According to the embodiments of the present disclosure, the data voltage signal line is located in the first metal layer, the input sub-circuit includes an input transistor, a first electrode connection portion of the input transistor is located in the semiconductor layer, a gate electrode of the input transistor is formed as an integral structure with the scan signal line, the first electrode connection portion of the input transistor is connected to a first electrode of the input transistor through a first via hole, the first electrode of the input transistor is connected to the data voltage signal line, and a second electrode of the input transistor is connected to the driving sub-circuit; and wherein the first via hole penetrates the first gate insulating layer and the interlayer insulating layer, and the first via hole is located between the scan signal line and the reset signal line.

According to the embodiments of the present disclosure, the driving sub-circuit includes a driving transistor and a storage capacitor; wherein a gate electrode of the driving transistor is connected to the reset sub-circuit and a first plate of the storage capacitor, a first electrode of the driving transistor is connected to the input sub-circuit, a second electrode of the driving transistor is connected to the light-emission control sub-circuit, and a second plate of the storage capacitor is connected to the light-emission control sub-circuit and the first power line; and wherein the driving transistor and the storage capacitor are located between the light-emission control line and the scan signal line.

According to the embodiments of the present disclosure, the at least one pixel circuit further includes a second gate layer provided between the first gate layer and the interlayer insulating layer, and a second gate insulating layer is provided between the first gate layer and the second gate layer; wherein the first plate of the storage capacitor is formed as an integral structure with the gate electrode of the driving transistor, and the second plate of the storage capacitor is located in the second gate layer; and wherein the second plate of the storage capacitor is connected to the first power line through a second via hole penetrating the interlayer insulating layer.

According to the embodiments of the present disclosure, the first plate of the storage capacitor is connected to the reset sub-circuit through a conductive portion located in the first metal layer; and wherein the first plate of the storage capacitor is connected to the conductive portion through a third via hole, wherein the third via hole penetrates the second gate insulating layer, the second gate layer and the interlayer insulating layer.

According to the embodiments of the present disclosure, the reference signal line is located in the second gate layer, the reset sub-circuit includes a reset transistor, and a second electrode connection portion of the reset transistor is located in the semiconductor layer; wherein a gate electrode of the reset transistor is formed as an integral structure with the reset signal line, a second electrode connection portion of the reset transistor is connected to a second electrode of the reset transistor through a fourth via hole, the second electrode of the reset transistor is connected to the reference signal line, a first electrode connection portion of the reset transistor is connected to a first electrode of the reset transistor through a fifth via hole, and the first electrode of the reset transistor is connected to the conductive portion; and wherein the fourth via hole penetrates the first gate insulating layer and the second gate insulating layer and is located on a side of the reset signal line away from the scan signal line, and the fifth via hole penetrates the first gate insulating layer, the second gate insulating layer and the interlayer insulating layer and is located between the reset signal line and the scan signal line.

According to the embodiments of the present disclosure, the at least one pixel circuit further includes a planarization layer on a side of the first metal layer away from the substrate, the light-emission control sub-circuit includes a first light-emission control transistor and a second light-emission control transistor, and a first electrode connection portion of the first light-emission control transistor is located in the semiconductor layer; wherein a gate electrode of the first light-emission control transistor, a gate electrode of the second light-emission control transistor and the light-emission control line are formed as an integral structure, the first electrode connection portion of the first light-emission control transistor is connected to a first electrode of the first light-emission control transistor through a sixth via hole, the first electrode of the first light-emission control transistor is connected to the first power line, and a second electrode of the first light-emission control transistor is connected to the driving sub-circuit; and a first electrode of the second light-emission control transistor is connected to the driving sub-circuit, a second electrode of the second light-emission control transistor is connected to the conductive structure, and the conductive structure is located in a seventh via hole; and wherein the sixth via hole penetrates the gate insulating layer and the interlayer insulating layer, the seventh via hole penetrates the planarization layer, and the sixth via hole and the seventh via hole are located on a side of the light-emission control line away from the scan signal line.

A second aspect of the present disclosure provides a display panel including the display substrate described above.

A third aspect of the present disclosure provides a display device including the display panel described above.

BRIEF DESCRIPTION OF THE DRAWINGS

The above content and other objectives, features and advantages of the present disclosure will be more apparent through the following descriptions of the embodiments of the present disclosure with reference to the accompanying drawings.

DETAILED DESCRIPTION OF EMBODIMENTS

Figure 1:
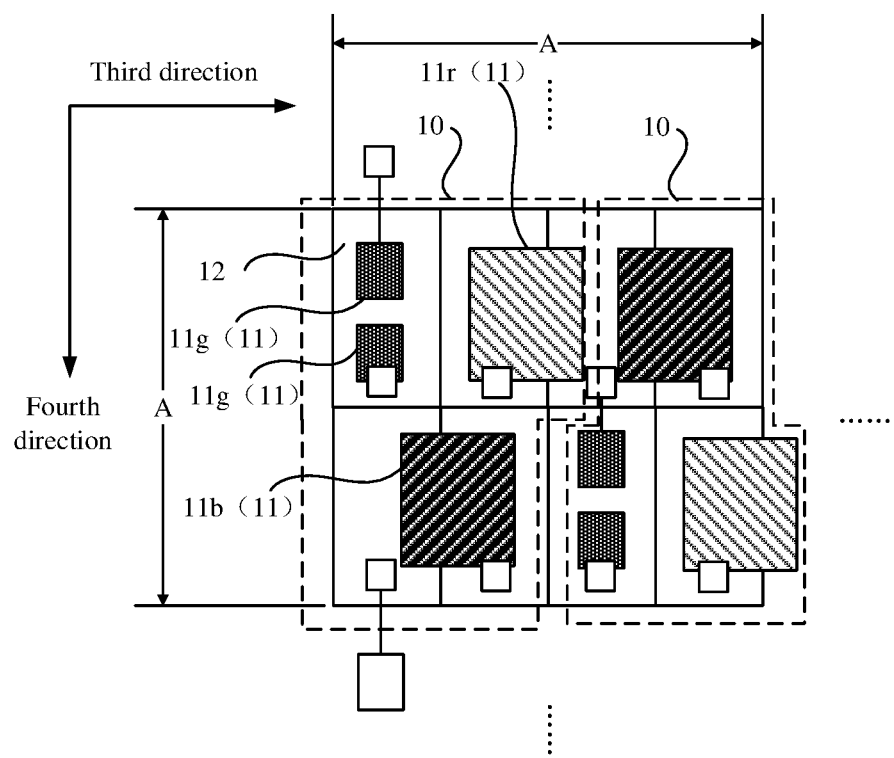
FIG. 1 schematically shows a schematic plan view of a display substrate in an example.

In order to make the objectives, technical solutions and advantages of the present disclosure more apparent, the technical solutions of the embodiments of the present disclosure are clearly and completely described below with reference to the accompanying drawings. Obviously, the described embodiments are only some embodiments of the present disclosure, rather than all the embodiments. Based on the described embodiments of the present disclosure, all additional embodiments obtained by those ordinary skilled in the art without carrying out inventive effort fall within the scope of protection of the present disclosure.

It should be noted that, in the drawings, for clarity and/or description purposes, a size and a relative size of an element may be enlarged. Accordingly, the size and relative size of each element need not to be limited to those shown in the drawings. In the specification and drawings, the same or similar reference numerals indicate the same or similar components.

When an element is described as being "on", "connected to" or "coupled to" another element, the element may be directly on the another element, directly connected to the another element, or directly coupled to the another element, or an intermediate element may be provided. However, when an element is described as being "directly on", "directly connected to" or "directly coupled to" another element, no intermediate element is present. Other terms and/or expressions used to describe a relationship between elements, such as "between" and "directly between", "adjacent" and "directly adjacent", "on" and "directly on", and so on, should be interpreted in a similar manner. In addition, the term "connection" may refer to a physical connection, an electrical connection, a communication connection, and/or a fluid connection, etc. In addition, X-axis, Y-axis and Z-axis are not limited to three axes of a rectangular coordinate system, and may be interpreted in a broader meaning. For example, the X-axis, the Y-axis and the Z-axis may be perpendicular to each other, or may represent different directions that are not perpendicular to each other. For the objective of the present disclosure, "at least one of X, Y and Z" and "at least one selected from a group consisting of X, Y and Z" may be interpreted as only X, only Y, only Z, or any combination of two or more of X, Y and Z, such as XYZ, XY, YZ and XZ. As used herein, the term "and/or" includes any and all combinations of one or more of the listed related items.

It should be noted that although the terms "first", "second", and so on may be used here to describe various components, members, elements, regions, layers and/or parts, these components, members, elements, regions, layers and/or parts should not be limited by these terms. Rather, these terms are used to distinguish one component, member, element, region, layer and/or part from another. Thus, for example, a first component, a first member, a first element, a first region, a first layer and/or a first part discussed below may be referred to as a second component, a second member, a second element, a second region, a second layer and/or a second part without departing from teachings of the present disclosure.

For ease of description, spatial relationship terms, such as "upper", "lower", "left", "right", etc., may be used herein to describe a relationship between one element or feature and another element or feature as shown in the drawing. It should be understood that the spatial relationship terms are intended to cover other different orientations of a device in use or operation in addition to the orientation described in the drawing. For example, if a device in the drawing is turned upside down, an element or feature described as "below" or "under" another element or feature will be oriented "above" or "on" the another element or feature.

Those skilled in the art should understand that herein, unless otherwise specified, the expression "thickness" refers to a size in a direction perpendicular to a surface of a display substrate provided with various film layers, that is, a size in a light exit direction of the display substrate.

In the present disclosure, unless otherwise specified, the expression "patterning process" generally includes steps of photoresist coating, exposure, development, etching, photoresist stripping and the like. The expression "one-time patterning process" means a process of forming patterned layers, components, members and so on by using one mask.

It should be noted that the expressions "the same layer", "arrangement in the same layer" or similar expressions refer to a layer structure formed by firstly using the same film forming process to form a film layer for forming a specific pattern, and then using the same mask to pattern the film layer by using a one-time patterning process. Depending on the specific patterns, the one-time patterning process may include multiple exposure, development or etching processes, and the specific pattern in the layer structure formed may be continuous or discontinuous. These specific patterns may also be located at different heights or have different thicknesses.

In the present disclosure, unless otherwise specified, the expression "electrically connected" may represent that two components or elements are directly electrically connected. For example, a component or an element A is in direct contact with a component or an element B, and an electrical signal may be transmitted between the two. It may also represent that two components or elements are electrically connected through a conductive medium such as a conductive wire. For example, a component or an element A is electrically connected to a component or an element B through a conductive wire so as to transmit an electrical signal between the two. Alternatively, it may also represent that two components or elements are electrically connected through at least one electronic component. For example, a component or an element A is electrically connected to a component or an element B through at least one thin film transistor so as to transmit an electrical signal between the two.

FIG. 1 schematically shows a schematic plan view of a display substrate in an example. As shown in FIG. 1, in the related art, the display substrate includes a plurality of pixel units 10, and at least one pixel unit 10 includes a light emitting device 11 for emitting light and a pixel circuit 12 for providing a driving current to the light emitting device 11. At present, in order to increase a pixel density, that is, to provide more pixel units 10 in a unit area, it is generally needed to reduce a size of the pixel circuit 12 of the pixel unit 10, for example, reduce a size of the pixel circuit 12 in a third direction (i.e., a row direction of the display substrate in FIG. 1), or reduce a size of the pixel circuit 12 in a fourth direction (i.e., a column direction of the display substrate in FIG. 1), or reduce both the size of the pixel circuit 12 in the third direction and the size of the pixel circuit 12 in the fourth direction. However, in order to ensure electrical performances of transistors and capacitors in the pixel circuit 12, the size of the pixel circuit 12 may only be reduced to a certain extent. Therefore, it is difficult to achieve a high pixel density.

Exemplarily, as shown in FIG. 1, at least one pixel unit 10 in the display substrate includes a red light emitting device 11r, a blue light emitting device 11b and a green light emitting device 11g, wherein the at least one pixel unit may include two green light emitting devices 11g. In this example, two pixel units 10 are distributed in a square region with a side length of A.

Figure 2:
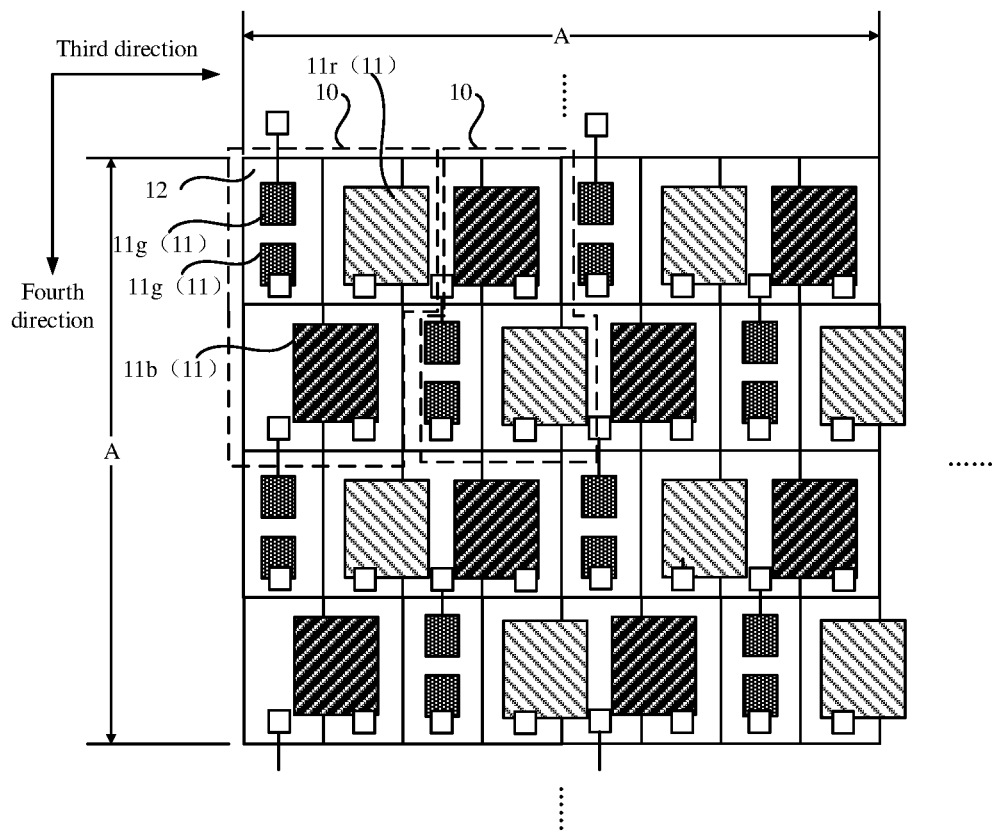
FIG. 2 schematically shows a schematic plan view of a display substrate in another example.

FIG. 2 schematically shows a schematic plan view of a display substrate in another example. As shown in FIG. 2, in this example, eight pixel units 10 may be distributed in the square region with the side length of A by reducing the size of the pixel circuit 12 of the at least one pixel unit 10 in the third direction and in the fourth direction, so that the pixel density of the display substrate is increased. However, in the above-mentioned method, it is required to reduce the size of the pixel circuit 12 in the third direction and the size of the pixel circuit 12 in the fourth direction to ½ of the original size. Thus, the increase of the pixel density is obviously limited by the size of the pixel circuit 12. In order to ensure the electrical performances of transistors, capacitors and other devices in the pixel circuit 12, it is difficult to further reduce the size of the pixel circuit 12, and it is therefore difficult to further increase the pixel density.

In view of this, the embodiments of the present disclosure provide a display substrate, including a substrate, and a plurality of pixel circuits and a plurality of light emitting devices arranged on the substrate. The plurality of pixel circuits are arranged in an array, and at least one pixel circuit is connected to a corresponding light emitting device through a conductive structure. Some pixel circuits in at least one column include a first pixel circuit and a second pixel circuit. At least one group of first pixel circuits and corresponding second pixel circuits are formed so that: the second pixel circuit is arranged on a side of the first pixel circuit away from the substrate, an orthographic projection of the second pixel circuit on the substrate partially overlaps with an orthographic projection of the first pixel circuit on the substrate, an overlapping portion defines a first pattern, and an orthographic projection of a conductive structure of the first pixel circuit on the substrate, the first pattern and an orthographic projection of a conductive structure of the second pixel circuit on the substrate are sequentially arranged in a first direction. The first direction may be determined according to an extension direction of the pixel circuit. Exemplarily, the first direction may be the same as the extension direction of the pixel circuit. For example, when the pixel circuit extends in the row direction of the display substrate, the first direction is the row direction of the display substrate. For example, when the pixel circuit extends in the column direction of the display substrate, the first direction is the column direction of the display substrate. In the embodiments of the present disclosure, the display substrate of the embodiments of the present disclosure is described by taking the first direction being the column direction of the display substrate as an example.

By using the display substrate of the embodiments of the present disclosure, it is possible to achieve the pixel density of the display substrate as shown in FIG. 2 on the basis of slightly changing (or even not changing) the size of the pixel circuit in the first direction, so as to reduce a restriction of the size of the pixel circuit on the pixel density, which is conductive to further increase the pixel density.

A specific structure of the display substrate according to the embodiments of the present disclosure will be described in detail below with reference to FIG. 3a to FIG. 12c.

Figure 3A:
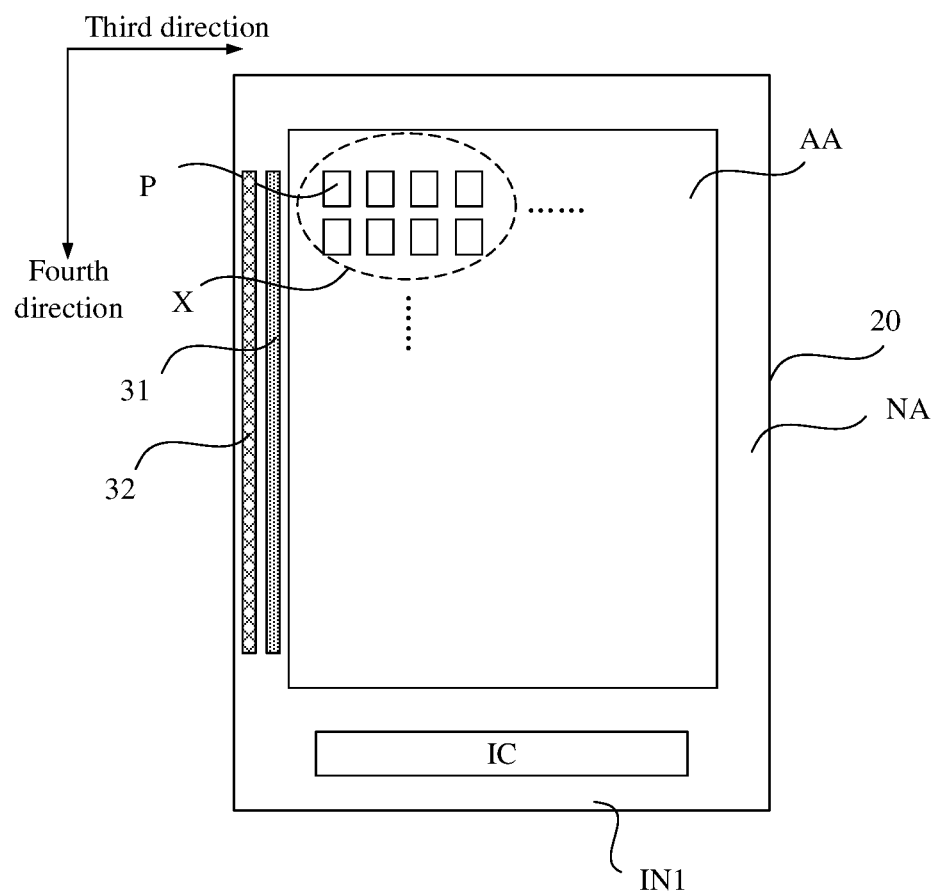
FIG. 3a schematically shows an overall schematic diagram of a display substrate provided according to the embodiments of the present disclosure.

FIG. 3a schematically shows an overall schematic diagram of a display substrate provided according to the embodiments of the present disclosure. As shown in FIG. 3a, in some specific embodiments, the display substrate may include the substrate 20, and a plurality of pixel circuits and a plurality of light emitting devices arranged on the substrate. Exemplarily, the display substrate includes a plurality of pixel units P provided in a display region AA, and the plurality of pixel units P may be arranged on the substrate 20 in an array in the third direction and the fourth direction. At least one pixel unit P may further include a plurality of sub-pixels, and at least one sub-pixel includes a light emitting device of one color and a pixel circuit for providing a driving current to the light emitting device.

The display substrate includes a signal input side IN1 (a lower side shown in FIG. 3). A data driving chip IC may be provided on the signal input side IN1. The data driving chip IC may be electrically connected to the pixel unit P located in the display region through a plurality of signal lines, and the pixel circuit 21 may be electrically connected to the data driving chip IC. In this way, signals such as a data voltage signal and the like may be transmitted from the signal input side IN1 to the plurality of sub-pixels.

As shown in FIG. 3a, a peripheral region NA may be located on four sides of the display region AA, that is, the peripheral region NA surrounds the display region AA.

It should be noted that in FIG. 3a, the pixel unit P and the sub-pixel are schematically shown in rectangular shapes, however, this does not constitute a limitation on the shapes of the pixel unit and the sub-pixel included in the display panel provided by the embodiments of the present disclosure.

In some specific embodiments, the display substrate may include a scan driving circuit provided on the substrate 20 and located in the peripheral region NA. For example, the scan driving circuit may include a plurality of cascaded shift register units.

As shown in FIG. 3a, the scan driving circuit may include a first scan driving circuit 31 for generating a scan signal and a second scan driving circuit 32 for generating a light-emission control signal. For example, the first scan driving circuit 31 may be a gate scan driving circuit (Gate GOA), and the second scan driving circuit 32 may be a light-emission control scan driving circuit (EM GOA). Exemplarily, the first scan driving circuit 31 may include a plurality of cascaded gate scan shift register units used to provide the plurality of pixel units P with, for example, scan signals shifted row-by-row. The second scan driving circuit 32 may include a plurality of cascaded light-emission control scan shift register units used to provide the plurality of pixel units P with, for example, light-emission control signals shifted row-by-row.

In the GOA technology, instead of an external driving chip, the gate driving circuit and the light-emission control scan driving circuit are directly arranged on the display substrate. For example, each GOA unit may act as a stage of shift register unit, and each stage of shift register unit may be electrically connected to a gate line or a light-emission control line. Each stage of shift register unit may output a turn-on voltage in turn so as to achieve a row-by-row scanning of the pixel units P. In some embodiments, each stage of shift register unit may also be connected to a plurality of gate lines or a plurality of light-emission control lines. This may adapt to a development trend of a high resolution and a narrow bezel of a display panel.

Figure 3B:
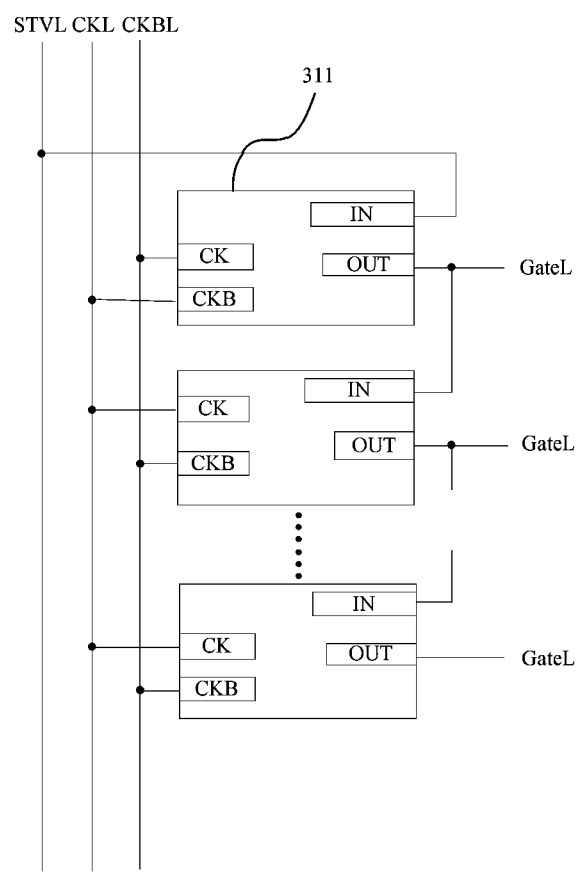
FIG. 3b schematically shows a schematic diagram of a first scan driving circuit provided according to the embodiments of the present disclosure.

Exemplarily, FIG. 3b schematically shows a schematic diagram of a first scan driving circuit provided according to the embodiments of the present disclosure. As shown in FIG. 3b, when a plurality of gate scan shift register units 311 are cascaded, a first clock signal terminal CK of an odd-numbered stage of gate scan shift register unit 311 is connected to a first clock signal line CKL, and a second clock signal terminal CKB of the odd-numbered stage of gate scan shift register unit 311 is connected to a second clock signal line CKBL; a first clock signal terminal CK of an even-numbered stage of gate scan shift register unit 311 is connected to the second clock signal line CKBL, and a second clock signal terminal CKB of the even-numbered stage of gate scan shift register unit 311 is connected to the first clock signal line CKL. An input terminal IN of a first stage of gate scan shift register unit 311 is connected to a trigger signal line STVL to receive a trigger signal as an input signal, while an input terminal IN of each of other stages of gate scan shift register units 311 is connected to an output terminal GOUT of a previous stage of gate scan shift register unit 311 to receive an output signal output by the output terminal GOUT of the previous stage of gate scan shift register unit 311 as an input signal, so as to achieve a shift output, and scan the array of pixel units P located in the display region row by row through a scan signal line GateL.

In the embodiments of the present disclosure, the light emitting device may be an organic light emitting diode (OLED), a quantum dot light emitting diode (QLED) or the like. The light emitting device may include a first electrode, a second electrode, and a light emitting layer arranged between the first electrode and the second electrode.

One of the first electrode and the second electrode is an anode electrode, and the other is a cathode electrode. For example, the first electrode may be the cathode electrode, and the second electrode may be the anode electrode. A material of the first electrode may include a conductive metal material, such as magnesium, aluminum, lithium and other metals and their alloys, or indium tin oxide (ITO), indium zinc oxide (IZO). A material of the second electrode may include a transparent conductive material, such as indium tin oxide (ITO), indium zinc oxide (IZO), and the like. The light emitting layer may have a multilayer structure, for example, it may include a multilayer structure including a hole injection layer, a hole transport layer, an organic light emitting layer, an electron transport layer and an electron injection layer.

It should be noted that an active drive or a passive drive may be adopted for the light emitting device of the organic light emitting diode. A passive drive OLED display substrate includes a cathode electrode and an anode electrode, an intersection of the anode electrode and the cathode electrode may emit light, and a driving circuit may be externally mounted by a connection method such as a tape carrier package or a chip-on-glass. An active drive OLED display substrate may provide each sub-pixel with a pixel circuit. The pixel circuit may include a thin film transistor with a switching function (that is, a switching transistor), a thin film transistor with a driving function (that is, a driving transistor), and a storage capacitor. In addition, the pixel circuit may further include other types of thin film transistors with a compensation function. The pixel circuit operates under a control of the data voltage signal, the scan signal and the light-emission control signal so as to drive the light emitting device to emit light, and thereby achieving operations such as display and so on.

Figure 4:
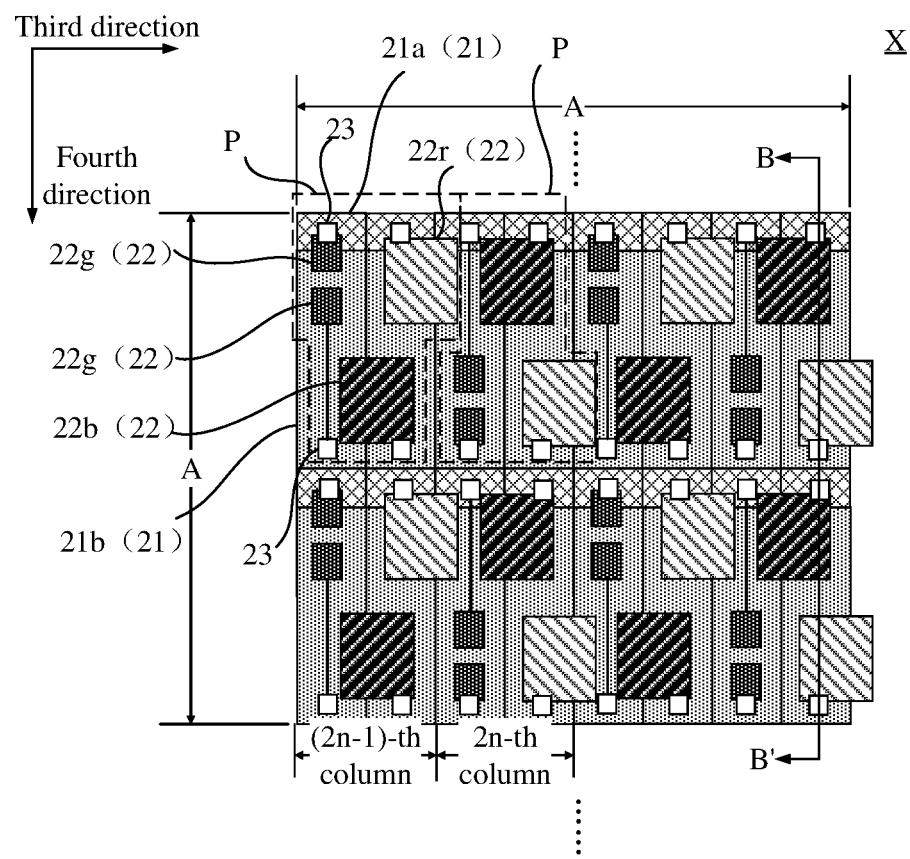
FIG. 4 schematically shows a schematic diagram of a region X in FIG. 3.
Figure 5:
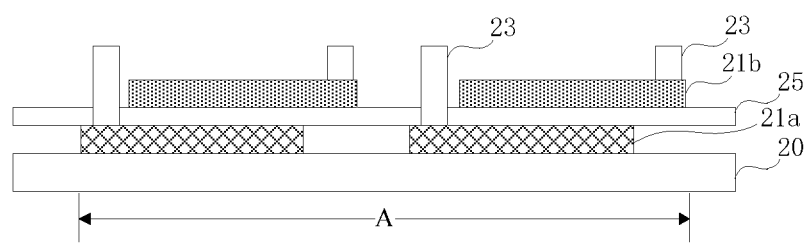
FIG. 5 schematically shows a cross-sectional view of FIG. 4 taken along a section line BB'.

FIG. 4 schematically shows a schematic diagram of a region X in FIG. 3. FIG. 5 schematically shows a cross-sectional view of FIG. 4 taken along a section line BB'. For sake of clarity, only a partial structure of the display substrate is schematically shown in FIG. 5. With reference to FIG. 4 and FIG. 5, a plurality of light emitting devices include a red light emitting device 22r, a green light emitting device 22g, and a blue light emitting device 22b. At least one pixel unit P includes a plurality of sub-pixels, and at least one sub-pixel includes a light emitting device 22 of one color and a pixel circuit 21 for providing the light emitting device 22 with a driving current. FIG. 4 schematically shows that the pixel unit P includes four sub-pixels, that is, the pixel unit P includes four light emitting devices 22, for example, one red light emitting device 22r, two green light emitting devices 22g and one blue light emitting device 22b. The plurality of pixel circuits 21 are arranged in an array, and at least one pixel circuit 21 is connected to a corresponding light emitting device 22 through a conductive structure 23.

In the embodiments of the present disclosure, the light emitting device 22 corresponding to the pixel circuit 21 may refer to the light emitting device 22 belonging to a same sub-pixel as the pixel circuit 21. The pixel circuit 21 may provide the light emitting device 22 corresponding to the pixel circuit 21 with a driving current to through the conductive structure 23, so as to drive the light emitting device 22 to emit light. As shown in FIG. 4, the third direction is the row direction of the display substrate, and the fourth direction is the column direction of the display substrate. In the fourth direction, a first pixel circuit 21a and a second pixel circuit 21b adjacent to the first pixel circuit 21a may constitute a group. In the embodiments of the present disclosure, the second pixel circuit 21b adjacent to the first pixel circuit 21a refers to a second pixel circuit 21b without other pixel circuits 21 being arranged between the first pixel circuit 21a and the second pixel circuit 21b in a column of pixel circuits 21 to which the first pixel circuit 21a belongs. For example, as shown in FIG. 4, the first pixel circuit 21a and the second pixel circuit 21b located below the first pixel circuit 21a constitute a group.

As shown in FIG. 5, in the embodiments of the present disclosure, in at least one group formed by a first pixel circuit 21a and a corresponding second pixel circuits 21b, the second pixel circuit 21b is arranged on a side of the first pixel circuit 21a away from the substrate 20.

As shown in FIG. 5, in the embodiments of the present disclosure, an orthographic projection of the second pixel circuit 21b on the substrate 20 partially overlaps with an orthographic projection of the first pixel circuit 21a on the substrate 20, and an overlapping portion defines a first pattern. An orthographic projection of the conductive structure 23 of the first pixel circuit 21a on the substrate 20, the first pattern and an orthographic projection of the conductive structure 23 of the second pixel circuit 21b on the substrate 20 are sequentially arranged in the column direction of the plurality of pixel circuits 2. In other words, at least one group of the first pixel circuits 21a and the corresponding second pixel circuit 21b are partially overlapped, so that a total area occupied by the pixel circuit 21 in the display substrate is reduced. Furthermore, in the embodiments of the present disclosure, the orthographic projection of the conductive structure 23 of the first pixel circuit 21a on the substrate 20, the first pattern and the orthographic projection of the conductive structure 23 of the second pixel circuit 21b on the substrate 20 are sequentially arranged in the fourth direction. Exemplarily, as shown in FIG. 5, the conductive structure 23 of the first pixel circuit 21a is arranged at a left end of the first pixel circuit 21a, and the conductive structure 23 of the second pixel circuit 21b is arranged at a right end of the second pixel circuit 21b. In this way, in the embodiments of the present disclosure, not only the total area occupied by the pixel circuit 21 in the display substrate is reduced, but also an overlapping area of the first pixel circuit 21a and the corresponding second pixel circuit 21b is maximized, so that the total area occupied by the pixel circuit 21 may be reduced to a great extent, thereby more pixel units P may be arranged in the display substrate to increase the pixel density. In other words, in the embodiments of the present disclosure, when increasing the pixel density, it is only required to slightly change (or even not required to change) the size of the pixel circuit 21 in the fourth direction, so that a restriction of the size of the pixel circuit 21 on the pixel density is reduced, which is conducive to achieve a higher pixel density.

It should be noted that, in the embodiments of the present disclosure, the orthographic projection of the pixel circuit 21 on the substrate 20 may be represented by an occupied area of the pixel circuit 21. The expression "the occupied area of the pixel circuit 21" refers to a maximum area covered by orthographic projections of various components (such as the plurality of transistors and the plurality of capacitors) included in the pixel circuit 21 on the substrate 20. For example, the orthographic projection of the various components included in the pixel circuit 21 on the substrate 20 has two sides that are farthest apart in the third direction and two sides that are farthest apart in the fourth direction. Extension lines of these four sides may intersect to form an area, which is the occupied area of the pixel circuit 21.

It should also be noted that, in the embodiments of the present disclosure, a type of transistors in the first pixel circuit 21a and a type of transistors in the second pixel circuit 21b may be the same, or partially the same, or completely different, which may be specifically determined according to actual needs. For example, the transistors in the first pixel circuit 21a and the transistors in the second pixel circuit 21b may be LTPS thin film transistors. Alternatively, the transistors in the first pixel circuit 21a may be LTPS thin film transistors, some transistors in the second pixel circuit 21b may be LTPS thin film transistors, and other transistors in the second pixel circuit 21b may be oxide thin film transistors. More specifically, a driving transistor in the second pixel circuit 21b may be an oxide thin film transistor, so that a leakage current generated by the driving transistor may be effectively reduced.

The display substrate of the embodiments of the present disclosure will be further described below with reference to FIG. 4 to FIG. 12c. Specifically, an arrangement of the first pixel circuit and the second pixel circuit in the display substrate in the embodiments of the present disclosure will be described firstly.

As shown in FIG. 4, in some specific embodiments, the plurality of light emitting devices 22 may include a plurality of colors. For example, the plurality of light emitting devices 22 may include a red light emitting device 22r, a green light emitting device 22g, and a blue light emitting device 22b. At least one color corresponds to a plurality of light emitting devices 22, and among the plurality of light emitting devices 22 of the at least one color, at least some light emitting devices 22 are connected to the first pixel circuit 21a, and at least some light emitting devices 22 are connected to the second pixel circuit 21b.

Optionally, among the light emitting devices 22 of the at least one color, a number of the light emitting devices 22 connected to the first pixel circuit 21a and a number of the light emitting devices 22 connected to the second pixel circuit 21b are approximately the same, so that a uniformity of the display may be improved.

In some specific embodiments, the plurality of light emitting devices 22 constitute a plurality of pixel units P, and at least one pixel unit P includes light emitting devices 22 of a plurality of colors. In the at least one pixel unit P, at least some light emitting devices 22 are connected to the first pixel circuit 21a, and at least some light emitting devices 22 are connected to the second pixel circuit 21b.

As mentioned above, the pixel unit P may include light emitting devices 22 of three colors, such as the red light emitting device 22r, the green light emitting device 22g, and the blue light emitting device 22b. In one pixel unit P, the light emitting device 22 of one color is connected to the first pixel circuit 21a, and the light emitting devices 22 of the other two colors are connected to the second pixel circuit 21b.

In some specific embodiments, at least one pixel unit P includes a light emitting device 22 of a first color, a light emitting device 22 of a second color, and a plurality of light emitting devices 22 of a third color, and the plurality of light emitting devices 22 of the third color may include a first light emitting device and a second light emitting device. For at least one pixel unit P, the light emitting device 22 of the first color is connected to one of the first pixel circuit 21a and the second pixel circuit 21b, and the light emitting device 22 of the second color is connected to the other of the first pixel circuit 21a and the second pixel circuit 21b. The first light emitting device is connected to one of the first pixel circuit 21a and the second pixel circuit 21b, and the second light emitting device is connected to the other of the first pixel circuit 21a and the second pixel circuit 21b.

In the embodiments of the present disclosure, at least one pixel unit P may include four light emitting devices. For example, the at least one pixel unit P may include a red light emitting device 22r, a blue light emitting device 22b, and two green light emitting devices 22g.

Optionally, for one of the plurality of pixel units P, the red light emitting device 22r may be connected to the first pixel circuit 21a, and the blue light emitting device 22b may be connected to the second pixel circuit 21b; or the blue light emitting device 22b may be connected to the first pixel circuit 21a, and the red light emitting device 22r may be connected to the second pixel circuit 21b. For the two green light emitting devices 22g, one may be connected to the first pixel circuit 21a, and the other may be connected to the second pixel circuit 21b.

In some specific embodiments, a plurality of pixel units are divided into a plurality of columns. In at least one pixel unit in a $(2n-1)^{th}$ column of pixel units, the light emitting device 22 of the first color is connected to the first pixel circuit 21a, the light emitting device 22 of the second color is connected to the second pixel circuit 21b, the first light emitting device is connected to the first pixel circuit 21a, and the second light emitting device is connected to the second pixel circuit 21b. In at least one pixel unit in a $2n^{th}$ column of pixel units, the light emitting device 22 of the first color is connected to the second pixel circuit 21b, the light emitting device 22 of the second color is connected to the first pixel circuit 21a, the first light emitting device is connected to the second pixel circuit 21b, and the second light emitting device is connected to the first pixel circuit 21a.

In the embodiments of the present disclosure, the same light emitting devices 22 in two pixel units P adjacent in the third direction are respectively connected to the first pixel circuit 21a and the second pixel circuit 21b, so that the first pixel circuit 21a and the second pixel circuit 21b may be evenly distributed in the display substrate, which is conducive to improve the uniformity of the display.

Exemplarily, in the pixel unit P in the $(2n-1)^{th}$ column, the red light emitting device 22r is connected to the first pixel circuit 21a, the blue light emitting device 22b is connected to the second pixel circuit 21b, one of the green light emitting devices 22g is connected to the first pixel circuit 21a, and the other of the green light emitting devices 22g is connected to the second pixel circuit 21b; in the pixel unit P in the $2n^{th}$ column, the red light emitting device 22r is connected to the second pixel circuit 21b, the blue light emitting device 22b is connected to the first pixel circuit 21a, one of the green light emitting devices 22g is connected to the second pixel circuit 21b, and the other of the green light emitting devices 22g is connected to the first pixel circuit 21a.

In some specific embodiments, the display substrate 1 may further include various signal lines arranged on the substrate 20. The various signal lines may include a data voltage signal line, a scan signal line, a light-emission control signal line, a first power line, a second power line and so on, so as to provide the pixel circuit 21 with various signals such as a data voltage signal, a scan signal, a light-emission control signal, a first power voltage, a second power voltage and so on.

For example, the first power line may be a wire for providing a VDD voltage signal, and the second power line may be a wire for providing a VSS voltage signal. For example, the first power line is electrically connected to a first electrode of the light emitting device 22, and the second power line is electrically connected to a second electrode of the light emitting device 22. It should be noted that "the first power line is electrically connected to a first electrode of the light emitting device 22" here may represent that the first power line is electrically connected to the first electrode 22a through an electronic element such as a thin film transistor as well as the conductive structure 23 in the pixel circuit 21.

A specific structure of the pixel circuit of the embodiments of the present disclosure will be described below.

The transistor used in the embodiments of the present disclosure may be a thin film transistor or a field effect transistor or other devices with the same or similar characteristics. Since a source electrode and a drain electrode of the transistor used are symmetrical, there is no difference between the source electrode and the drain electrode. In the embodiments of the present disclosure, in order to distinguish the source electrode and the drain electrode of the transistor, one electrode is referred to as a first electrode, the other electrode is referred to as a second electrode, and a gate electrode is referred to as a control electrode. In addition, according to characteristics of transistors, the transistors may be classified into N-type transistors and P-type transistors. The following embodiments are described using the P-type transistor. The P-type transistor is illustrated below by way of example. That is, each transistor is turned on when the gate electrode is connected to a low level (active level signal) and is turned off when the gate electrode is connected to a high level (inactive level signal). In this case, the first electrode of the transistor may be the source electrode, and the second electrode of the transistor may be the drain electrode.

Figure 6A:
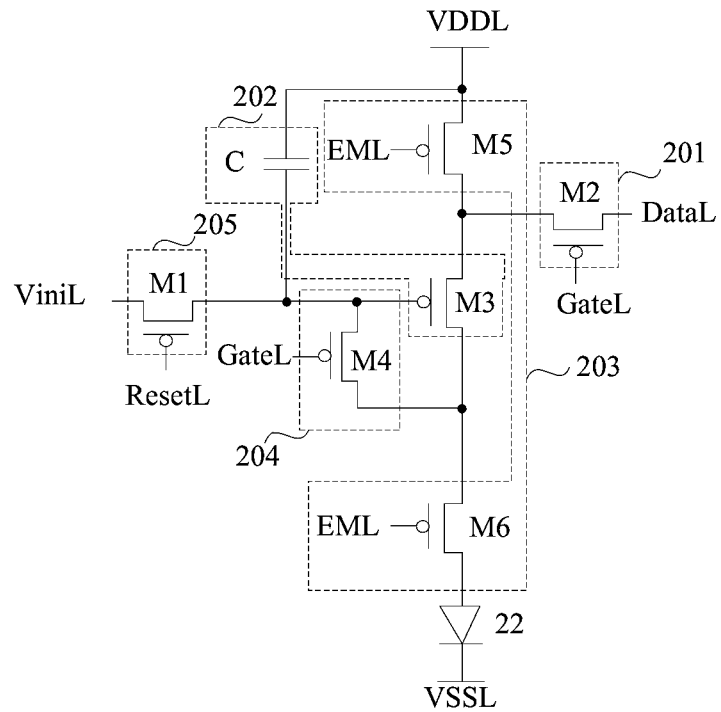
FIG. 6a schematically shows an equivalent circuit diagram of a pixel circuit provided according to the embodiments of the present disclosure.
Figure 7:
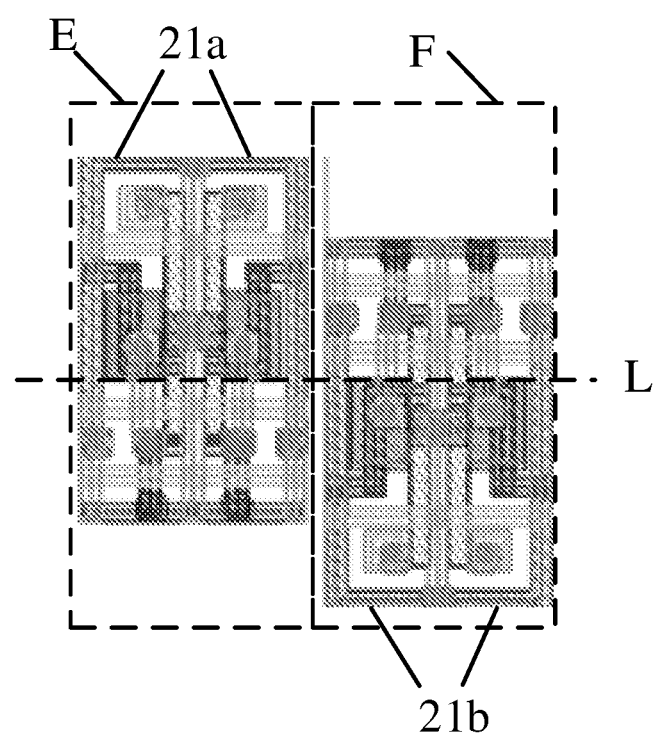
FIG. 7 schematically shows a schematic plan view of a first pixel circuit and a second pixel circuit provided according to the embodiments of the present disclosure.
Figure 8A:
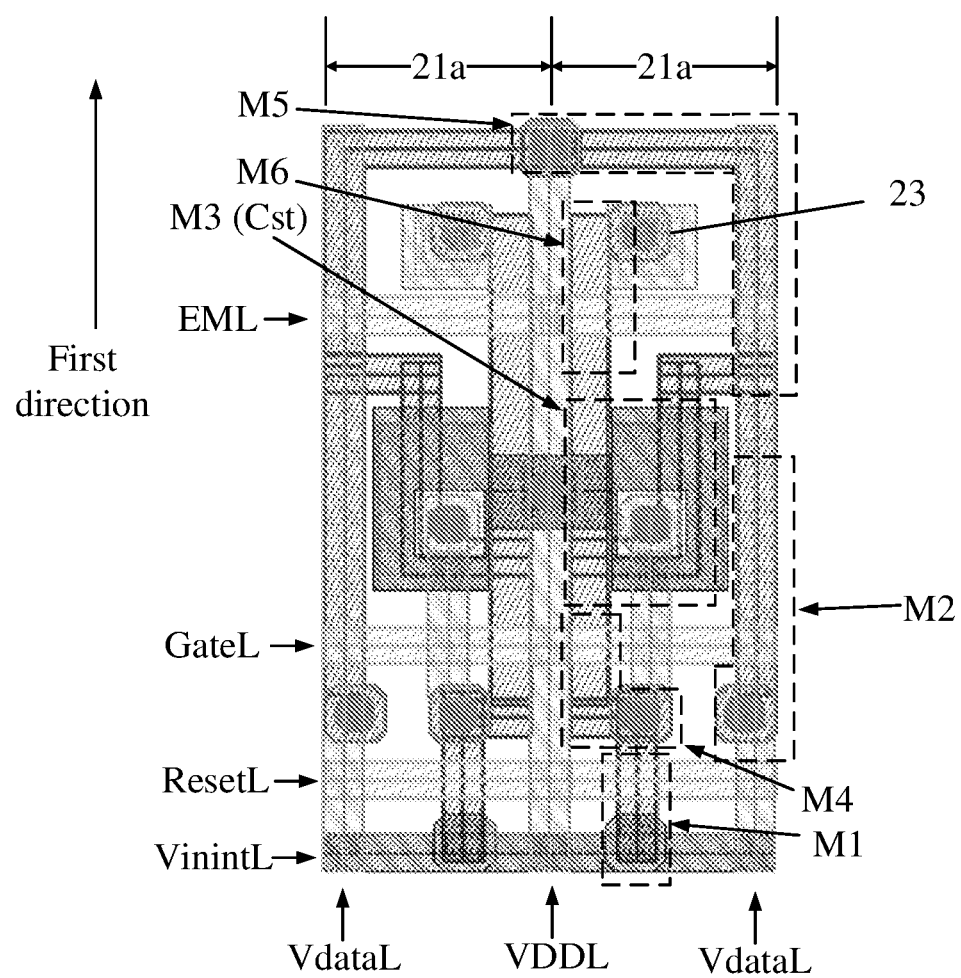
FIG. 8a schematically shows an enlarged view of a region E in FIG. 7.
Figure 8B:
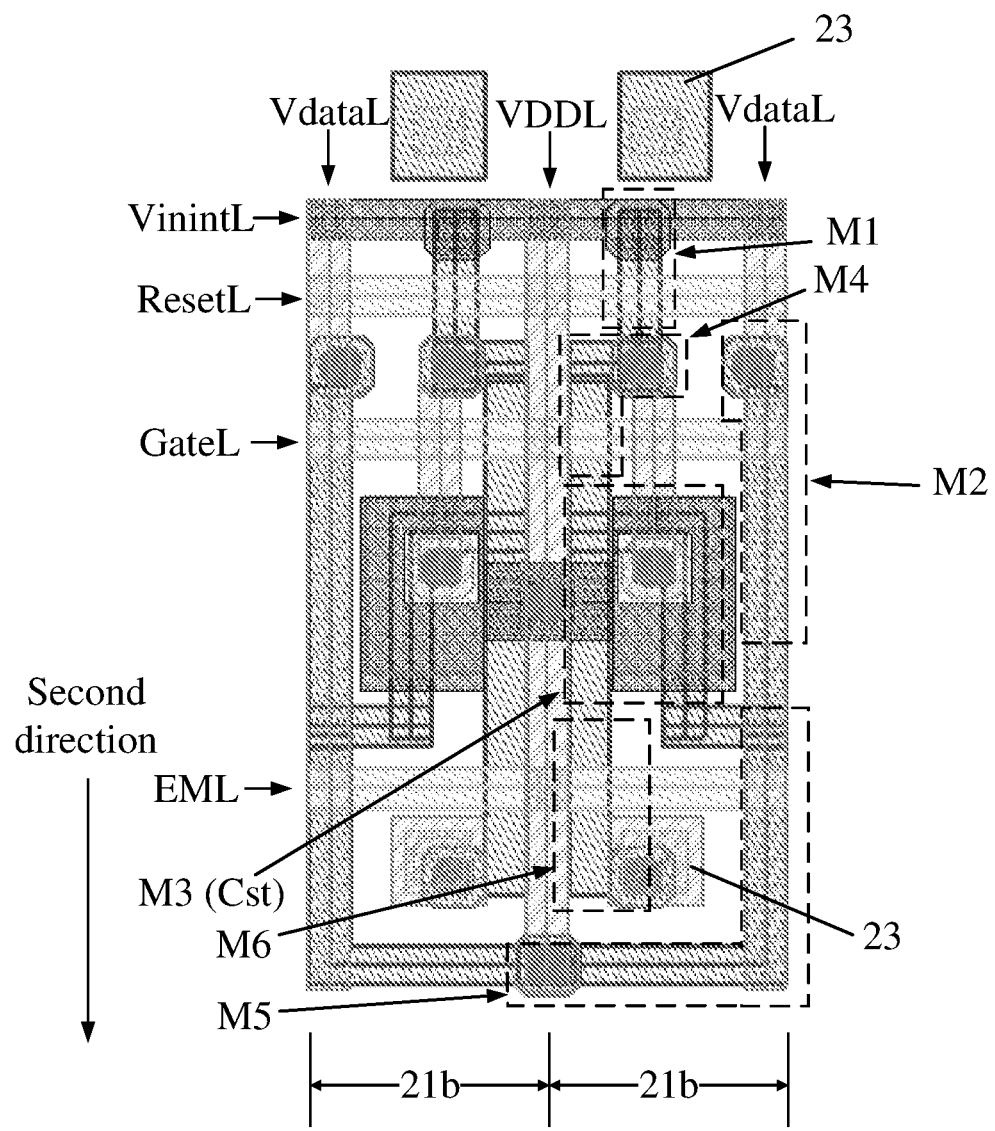
FIG. 8b schematically shows an enlarged view of a region F in FIG. 7.

FIG. 6a schematically shows an equivalent circuit diagram of a pixel circuit provided according to the embodiments of the present disclosure. FIG. 7 schematically shows a schematic plan view of a first pixel circuit and a second pixel circuit provided according to the embodiments of the present disclosure. For clarity, the second pixel circuit 21b in a region E and the first pixel circuit 21a in a region F are omitted in FIG. 7. FIG. 8a schematically shows an enlarged view of the region E in FIG. 7. FIG. 8b schematically shows an enlarged view of the region F in FIG. 7. FIG. 7 to FIG. 8b show a group of first pixel circuits and a group of second pixel circuits, the group of first pixel circuits includes two first pixel circuits 21a adjacent in the third direction, and the group of second pixel circuits includes two second pixel circuits 21b adjacent in the third direction. A specific solution for grouping the pixel circuits 21 will be described in detail below, which will not be described here.

With reference to FIG. 6a, FIG. 7 to FIG. 8b, in some specific embodiments, at least one pixel circuit 2 includes an input sub-circuit 201, a driving sub-circuit 202, and a light-emission control sub-circuit 203. The input sub-circuit 201 and the light-emission control sub-circuit 203 are connected to the driving sub-circuit 202, the input sub-circuit 201 is further connected to the scan signal line GateL and the data voltage signal line DateL, and the light-emission control sub-circuit 203 is further connected to the first power line VDDL, a light-emission control line EML and the conductive structure 23. The input sub-circuit 201 is configured to transmit a data voltage signal of the data voltage signal line DataL to the driving sub-circuit 202 in response to a control of the scan signal line GateL. The light-emission control sub-circuit 203 is configured to transmit a first voltage signal of the first power line VDDL to the driving sub-circuit 202 and transmit a driving current provided by the driving sub-circuit 202 to the conductive structure 23 in response to a control of the light-emission control line EML. The driving sub-circuit 202 is configured to provide a driving current according to the data voltage signal and the first voltage signal. The input sub-circuit 201 of at least one pixel circuit 2 (for example, an input transistor M2 in FIG. 8a) is located on a side of the light-emission control sub-circuit 203 (for example, a first light-emission control transistor M5 and a second light-emission control transistor M6 in FIG. 8a) close to the driving sub-circuit 202 (for example, a driving transistor M3 in FIG. 8a).

In the embodiments of the present disclosure, the input sub-circuit 201 includes the input transistor M2, the driving sub-circuit 202 includes the driving transistor M3 and a storage capacitor Cst, and the light-emission control sub-circuit 203 includes the first light-emission control transistor M5 and the second light-emission control transistor M6. A first electrode of the input transistor M2 is connected to the data voltage signal line DateL, a second electrode of the input transistor M2 is connected to a second electrode of the first light-emission control transistor M5 and a first electrode of the driving transistor M3, and a gate electrode of the input transistor M2 is connected to the scan signal line GateL. A first electrode of the first light-emission control transistor M5 is connected to the first power line VDDL and a second plate of the storage capacitor Cst, and a gate electrode of the first light-emission control transistor M5 is connected to the light-emission control line EML. A first electrode of the second light-emission control transistor M6 is connected to a second electrode of the driving transistor M3, a second electrode of the second light-emission control transistor M6 is connected to the conductive structure 23, and a gate electrode of the second light-emission control transistor M6 is connected to the light-emission control line EML.

In some specific embodiments, the at least one pixel circuit further includes a threshold compensation sub-circuit 204 connected to the scan signal line GateL, the gate electrode of the driving transistor M3 and the second electrode of the driving transistor M3. The threshold compensation sub-circuit 204 is configured to perform a threshold compensation on the driving transistor M3 in response to the control of the scan signal line GateL. The threshold compensation sub-circuit 204 is located on a side of the light-emission control sub-circuit 203 close to the driving sub-circuit 202.

In the embodiments of the present disclosure, the threshold compensation sub-circuit 204 includes a threshold compensation transistor M4. A second electrode of the threshold compensation transistor M4 is connected to the second electrode of the driving transistor M3, and a first electrode of the threshold compensation transistor M4 is connected to the gate electrode of the driving transistor M3 and a first plate of the storage capacitor Cst.

In some specific embodiments, the pixel circuit 2 further includes a reset sub-circuit 205, and the reset sub-circuit 205 is connected to the driving sub-circuit 202, a reference signal line ViniL and a reset signal line ResetL. The reset sub-circuit 205 is configured to transmit a reference signal of the reference signal line ViniL to the driving sub-circuit 202 in response to a control of the reset signal line ResetL. The reset sub-circuit 205 of the at least one pixel circuit 21 is located on a side of the driving sub-circuit 202 away from the light-emission control sub-circuit 203.

In the embodiments of the present disclosure, the reset sub-circuit 205 includes a reset transistor M1. A second electrode of the reset transistor M1 is connected to the reference signal line ViniL, a first electrode of the reset transistor M1 is connected to the gate electrode of the driving transistor M3, and a gate electrode of the reset transistor M1 is connected to the reset signal line ResetL.

Figure 6B:
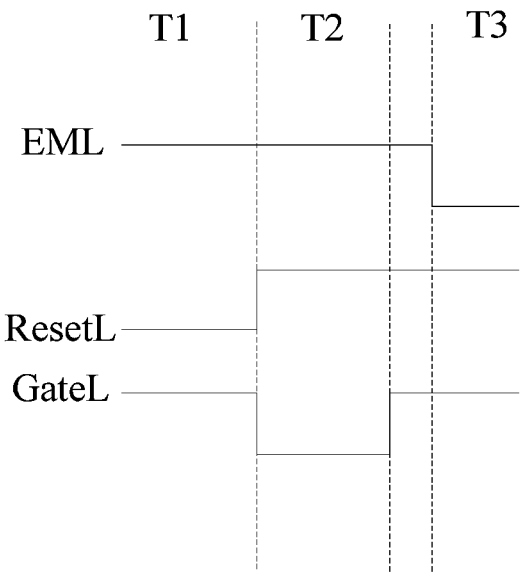
FIG. 6b schematically shows an operation sequence diagram of a pixel circuit provided according to embodiments of the present disclosure.

FIG. 6b schematically shows an operation sequence diagram of a pixel circuit provided according to the embodiments of the present disclosure. As shown in FIG. 6b, in the embodiments of the present disclosure, an operation sequence of the pixel circuit includes a reset phase T1, an input phase T2, and an output phase T3.

In the reset phase T1, an active level signal is provided to the reset signal line ResetL, and an inactive level signal is provided to the scan signal line GateL and the light-emission control signal line E-L. At this time, the reset transistor M1 is turned on, and other transistors are turned off, so that a voltage of the gate electrode of the driving transistor M3 is reset.

In the input phase T2, an active level signal is provided to the scan signal line GateL, and an inactive level signal is provided to the reset signal line ResetL and the light-emission control signal line EML. At this time, the input transistor M2 and the threshold compensation transistor M4 are turned on, and other transistors are turned off, so that the data voltage signal of the data voltage signal line DataL is transmitted to the gate electrode of the driving transistor M3.

In the output phase T3, an active level signal is provided to the light-emission control signal line EML, and an inactive level signal is provided to the reset signal line ResetL and the scan signal line GateL. At this time, the first light-emission control transistor M5 and the second light-emission control transistor M6 are turned on, and other transistors are turned off. The driving transistor M3 outputs a driving current according to a voltage between the gate electrode and the source electrode, and the driving current is transmitted to the light emitting device 22 through the second light-emission control transistor M6 and the conductive structure 23, so that the light emitting device 22 emits light.

It should be noted that, as shown in FIG. 6b, a certain buffer time may exist between the input phase T2 and the output phase T3 so as to ensure that a voltage of each node in the pixel circuit may reach a stable state when entering the output phase T3.

In the embodiments of the present disclosure, the driving sub-circuit 202 (that is, the driving transistor M3 and the storage capacitor Cst in FIG. 8a) and the light-emission control sub-circuit 203 (that is, the first light-emission control transistor M5 and the second light-emission control transistor M6 in FIG. 8a) of the at least one first pixel circuit 21a are sequentially arranged in the first direction. The driving sub-circuit 202 (that is, the driving transistor M3 and the storage capacitor Cst in FIG. 8b) and the light-emission control sub-circuit 203 (that is, the first light-emission control transistor M5 and the second light-emission control transistor M6 in FIG. 8b) of the at least one second pixel circuit 21b are sequentially arranged in the second direction. The first direction is the same as the column direction of the plurality of pixel circuits 2 (i.e., the third direction), and the second direction is opposite to the first direction. That is, an arrangement direction of the driving sub-circuit 202 and the light-emission control sub-circuit 203 of the first pixel circuit 21a is opposite to an arrangement direction of the driving sub-circuit 202 and the light-emission control sub-circuit 203 of the second pixel circuit 21b. The conductive structure 23 located above the second pixel circuit 23 in FIG. 8b is the conductive structure 23 of the first pixel circuit 21a corresponding to the second pixel circuit 21b.

As mentioned above, the type of transistors in the first pixel circuit 21a and the type of transistors in the second pixel circuit 21b may be the same, or partially the same, or completely different. When the same type of transistors are used, the orthographic projection of the first pixel circuit 21a on the substrate 20 and the orthographic projection of the second pixel circuit 21b corresponding to the first pixel circuit 21a on the substrate 20 may be symmetrical with respect to an imaginary line L in FIG. 7. when transistors used in the first pixel circuit 21a and the second pixel circuit 21b are partially the same or completely different, a structure of transistors in at least one sub-circuit may be changed without changing positions of the various sub-circuits in the first pixel circuit 21a and the second pixel circuit 21b. In this case, the orthographic projection of the first pixel circuit 21a on the substrate 20 and the orthographic projection of the second pixel circuit 21b corresponding to the first pixel circuit 21a on the substrate 20 may be substantially symmetrical with respect to the imaginary line L in FIG. 7.

In the embodiments of the present disclosure, the thin film transistors in the first pixel circuit 21a and the second pixel circuit 21b being the same type of transistors are illustrated by way of example to describe the various film layers of the pixel circuit in the embodiments of the present disclosure. More specifically, the transistors used in the first pixel circuit 21a and the transistors used in the second pixel circuit 21b may be LTPS thin film transistors.

In some specific embodiments, the total area occupied by the pixel circuit 21 may be optimized in the row direction.

Specifically, as shown in FIG. 8a and FIG. 8b, the first power line VDDL extends in the first direction. A plurality of first pixel circuits 21a arranged in the third direction are divided into a plurality of groups, at least one group includes a plurality of first pixel circuits 21a, the plurality of first pixel circuits 21a in the at least one group share a first power line VDDL, and the plurality of first pixel circuits 21a in the group are symmetrically arranged with respect to the first power line VDDL. A plurality of second pixel circuits 21b arranged in the third direction are divided into a plurality of groups, at least one group includes a plurality of second pixel circuits 21b, two second pixel circuits 21b in the at least one group share a first power line VDDL, and the two first pixel circuits 21a in that group are symmetrically arranged with respect to the first power line VDDL.

In the embodiments of the present disclosure, by sharing one first power line VDDL by a plurality of first pixel circuits 21a adjacent in the third direction, a number of the first power lines VDDL may be reduced, which is conductive to further increase the pixel density.

Figure 9A:
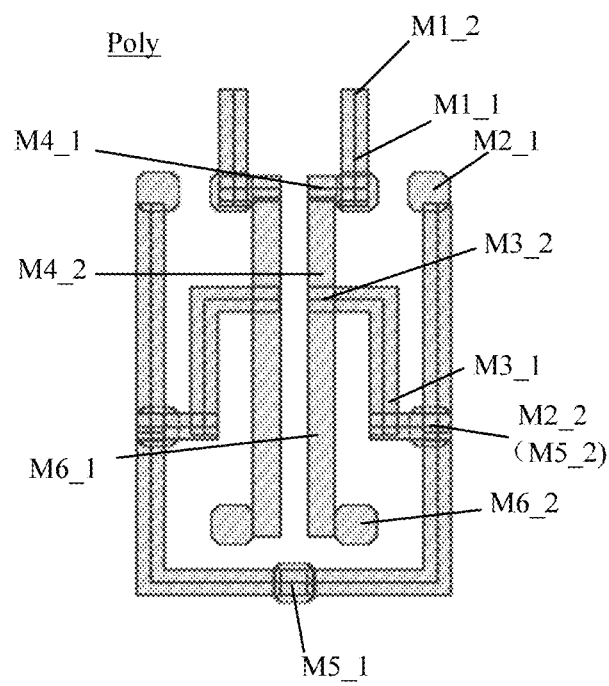
FIG. 9a to FIG. 9d schematically show schematic plan views of some film layers of a group of second pixel circuits provided according to the embodiments of the present disclosure.
Figure 9B:
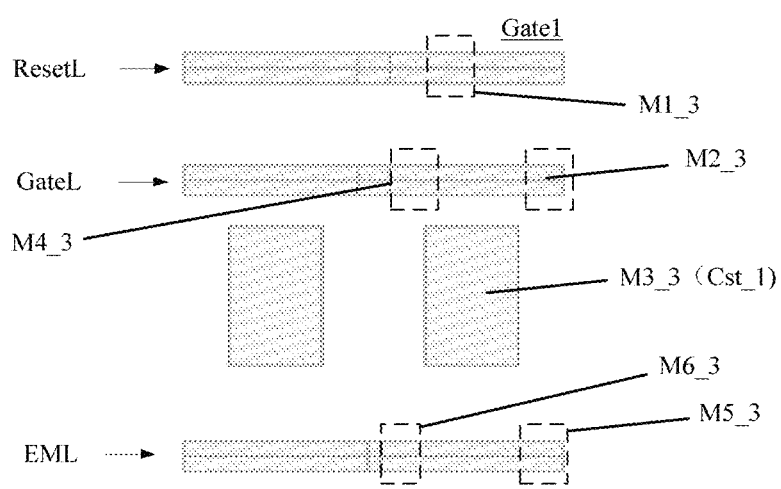
Figure 9C:
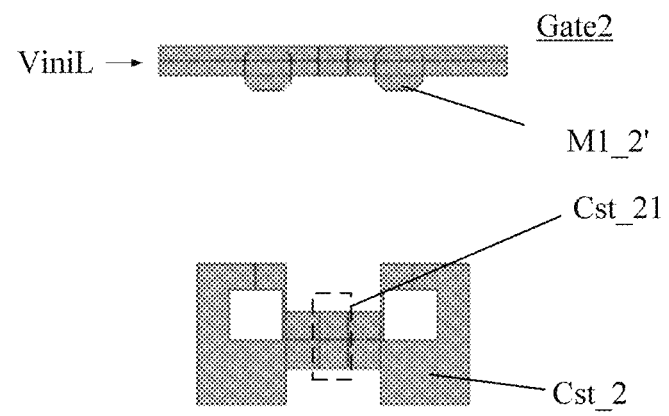
Figure 9D:
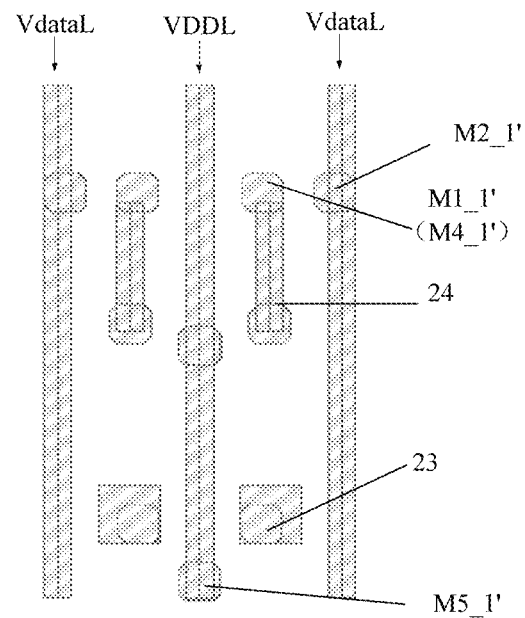
Figure 10:
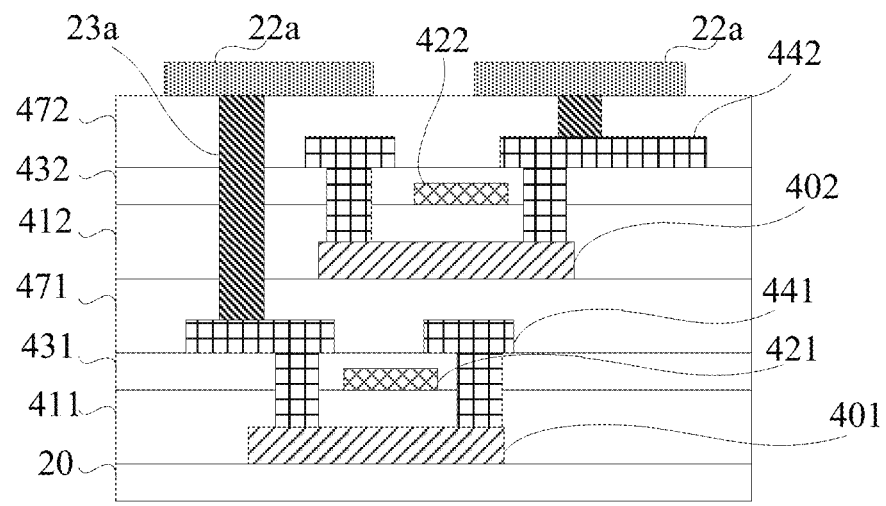
FIG. 10 schematically shows a first schematic diagram of a stacked structure of a first pixel circuit and a second pixel circuit provided according to the embodiments of the present disclosure.

FIG. 9a to FIG. 9d schematically show schematic plan views of some film layers of a group of second pixel circuits provided according to the embodiments of the present disclosure. FIG. 10 schematically shows a schematic diagram of a stacked structure of a first pixel circuit and a second pixel circuit provided according to the embodiments of the present disclosure. It should be noted that FIG. 10 is only intended to show film layers included in the first pixel circuit 21a and the second pixel circuit 21b as well as a positional relationship of the film layers in a thickness direction of the display substrate, rather than limit appearances of the first pixel circuit 21a and the second pixel circuit 21b in the embodiments of the present disclosure.

The second pixel circuit 21b is illustrated below by way of example to describe the structure of the pixel circuit of the embodiments of the present disclosure with reference to FIG. 9a to FIG. 10.

In some specific embodiments, at least one pixel circuit 21 includes a semiconductor layer 401, a first gate insulating layer 411, a first gate layer 421, an interlayer insulating layer 431 and a first metal layer 441 sequentially arranged in a direction away from the substrate 20.

In some specific embodiments, at least one pixel circuit 21 further includes: a second gate insulating layer 412 arranged on a side of the first gate layer away from the substrate 20, a second gate layer 422 arranged on a side of the second gate insulating layer away from the substrate 20, an interlayer dielectric layer 432 arranged between the second gate layer 422 and the first metal layer 442, and an insulating layer arranged on a side of the first metal layer 442 away from the substrate 20. Exemplarily, the insulating layer may be, for example, a passivation layer 472 or a planarization layer 38.

Optionally, film layers such as a buffer layer, a barrier layer and the like may be further provided between the substrate 10 and the semiconductor layer 401 of the first pixel circuit 21a.

Optionally, at least one of the first gate insulating layer 411, the second gate insulating layer 412, the interlayer dielectric layer 432 and the insulating layer may include a single-layer film structure or a stacked film structure. The first gate insulating layer 411 and the second gate insulating layer 412 may contain an inorganic insulating material. The interlayer dielectric layer 432 and the insulating layer may contain an inorganic insulating material, an organic insulating material, or any combination thereof. For example, the inorganic insulating material may include silicon oxide, silicon nitride, silicon oxynitride, or the like. The organic insulating material may include polyimide, polyamide, acrylic resin, phenol resin, benzocyclobutene, or the like.

Exemplarily, the first gate layer 421 may be a conductive layer formed of a gate material, and the first metal layer 441 may be a conductive layer formed of a source/drain material.

In some specific embodiments, the reset signal line ResetL, the scan signal line GateL and the light-emission control line EML are located in the first gate layer 421. The reset signal line ResetL, the scan signal line GateL and the light-emission control line EML connected to the first pixel circuit 21a are sequentially arranged in the first direction. The reset signal line ResetL, the scan signal line GateL and the light-emission control line EML connected to the second pixel circuit 21b are sequentially arranged in the second direction. That is, in the embodiments of the present disclosure, an arrangement direction of the reset signal line ResetL, the scan signal line GateL and the light-emission control line EML connected to the first pixel circuit 21a is opposite to an arrangement direction of the reset signal lines ResetL, the scan signal line GateL and the light-emission control line EML connected to the second pixel circuit 21b.

Optionally, the reset signal line ResetL, the scan signal line GateL and the light-emission control line EML extend in the third direction. As shown in FIG. 8a, for the first pixel circuit 21a, the reset signal line ResetL is located below the scan signal line GateL, and the light-emission control line EML is located above the scan signal line GateL. As shown in FIG. 8b, for the second pixel circuit 21b, the reset signal line ResetL is located above the scan signal line GateL, and the light-emission control line EML is located below the scan signal line GateL.

In some specific embodiments, an orthographic projection of the reset signal line ResetL connected to the first pixel circuit 21a on the substrate 20 is referred to as a first projection, an orthographic projection of the scan signal line GateL connected to the first pixel circuit 21a on the substrate 20 is referred to as a second projection, and an orthographic projection of the light-emission control line EML connected to the first pixel circuit 21a on the substrate 20 is referred to as a third projection; an orthographic projection of the reset signal line ResetL connected to the second pixel circuit 21b on the substrate 20 is referred to as a fourth projection, an orthographic projection of the scan signal line GateL connected to the second pixel circuit 21b on the substrate 20 is referred to as a fifth projection, and an orthographic projection of the light-emission control line EML connected to the second pixel circuit 21b on the substrate 20 is referred to as a sixth projection. The first projection may be located between the fifth projection and the sixth projection, and the fourth projection may be located between the second projection and the third projection.

Optionally, the second projection may be located between the fifth projection and the sixth projection, and the fifth projection may be located between the second projection and the third projection.

Optionally, a material of the first gate layer 421 may include a metal material, such as Mo, Al, Cu and other metals and their alloys.

In some embodiments, the semiconductor layer 401 is configured to form active layers of the various transistors. The data voltage signal line DataL is located in the first metal layer 441. The input sub-circuit 201 of the at least one pixel circuit 21 includes an input transistor M2. An active layer of the input transistor M2 includes a first electrode connection portion M2_1, a second electrode connection portion M2_2, and a channel portion located between the first electrode connection portion M2_1 and the second electrode connection portion M2_2. A gate electrode M2_3 of the input transistor M2 is formed as an integral structure with the scan signal line GateL, the first electrode connection portion M2_1 of the input transistor M2 is connected to a first electrode M2_1' of the input transistor M2 through a first via hole, and the first electrode M2_1' of the input transistor M2 is connected to the data voltage signal line DataL. Optionally, the second electrode connection portion M2_2 of the input transistor M2 is connected to a second electrode of the input transistor M2 through a via hole, and the second electrode of the input transistor M2 is connected to the driving sub-circuit 202. The first via hole penetrates the first gate insulating layer 411 and the interlayer insulating layer 431, and is located between the scan signal line GateL and the reset signal line ResetL.

Optionally, the data voltage signal line DataL extends in the third direction. As mentioned above, the first pixel circuits 21a (or the second pixel circuits 21b) of the same group are symmetrically arranged with respect to the first power line VDDL. Therefore, as shown in FIG. 9d, two columns of data voltage signal lines DataL connected to the first pixel circuits 21a (or the second pixel circuits 21b) of the same group may be symmetrically arranged with respect to the first power line VDDL.

Optionally, a material of the first metal layer 441 may include a metal material, such as Mo, Al, Cu and other metals and their alloys, or Ti/Al/Ti and other materials.

In some specific embodiments, the driving sub-circuit 202 includes the driving transistor M3 and the storage capacitor Cst. An active layer of the driving transistor M3 includes a first electrode connection portion M31, a second electrode connection portion M3_2, and a channel portion located between the first electrode connection portion M3_1 and the second electrode connection portion M3_2. A gate electrode M3_3 of the driving transistor M3 is connected to the reset sub-circuit 205 and the first plate Cst_1 of the storage capacitor Cst. For example, the gate electrode M3_3 of the driving transistor M3 is connected to a first electrode M1_1' of a reset transistor M1 of the reset sub-circuit 205 through a connection portion 25. Optionally, the first electrode connection portion M3_1 of the driving transistor M3 is connected to a first electrode of the driving transistor M3 through a via hole, and the first electrode of the driving transistor M3 is connected to the input sub-circuit 201. Optionally, the second electrode connection portion M32 of the driving transistor M3 is connected to a second electrode of the driving transistor M3 through a via hole, and the second electrode of the driving transistor M3 is connected to the light-emission control sub-circuit 203. The second plate Cst_2 of the storage capacitor Cst is connected to the light-emission control sub-circuit 203 and the first power line VDDL. For example, the second plate Cst_2 and a first electrode M5_1 of the first light-emission control transistor M5 of the light-emission control sub-circuit 203 are connected to the first power line VDDL. The driving transistor M3 and the storage capacitor Cst are located between the light-emission control line EML and the scan signal line GateL.

In some specific embodiments, the first plate Cst_1 of the storage capacitor Cst is formed as an integral structure with the gate electrode M3_3 of the driving transistor M3, and the second plate Cst_2 of the storage capacitor Cst is located in the second gate layer 422. The second plate Cst_2 of the storage capacitor Cst is connected to the first power line VDDL through the second via hole. For example, a contact portion Cst_21 of the second plate Cst_2 of the storage capacitor Cst is connected to a contact portion VDDL_1 of the first power line VDDL through the second via hole penetrating through the interlayer insulating layer 431.

In the embodiments of the present disclosure, the second plates Cst_2 of the storage capacitors Cst in the first pixel circuits 21a (or the second pixel circuits 21b) of the same group are connected to the contact portion VDDL_1 of the first power line VDDL through the same second via hole.

In some specific embodiments, the first plate Cst_1 of the storage capacitor Cst is connected to the reset sub-circuit 205 through a conductive portion 24 located in the first metal layer 441. The first plate of the storage capacitor Cst is connected to the conductive portion 24 through a third via hole. For example, the first plate Cst_1 of the storage capacitor Cst is connected to the conductive portion 24 through the third via hole. The third via hole penetrates the second gate insulating layer, the second gate layer 422 and the interlayer insulating layer 431.

In the embodiments of the present disclosure, the conductive portion 24 extends in the fourth direction, and an orthographic projection of the conductive portion 24 on the substrate 20 intersects with the orthographic projection of the scan signal line GateL on the substrate 20. Optionally, the orthographic projection of the conductive portion 24 on the substrate 20 is perpendicular to the orthographic projection of the scan signal line GateL on the substrate 20.

In some specific embodiments, the reference signal line ViniL is located in the second gate layer 422, and the reset sub-circuit 205 includes the reset transistor M1. An active layer of the reset transistor includes a first electrode connection portion M1_1, a second electrode connection portion M1_2, and a channel portion located between the first electrode connection portion M1_1 and the second electrode connection portion M1_2. A gate electrode M1_3 of the reset transistor M1 and the reset signal line ResetL are formed as an integral structure, the second electrode connection portion M1_2 of the reset transistor M1 is connected to a second electrode M1_2' of the reset transistor M1 through a fourth via hole, and a second electrode M1_2' of the reset transistor M1 is connected to the reference signal line ViniL. The first electrode connection portion M1_1 of the reset transistor M1 is connected to the first electrode M1_1' of the reset transistor M1 through a fifth via hole, and the first electrode M1_1' of the reset transistor M1 is connected to the conductive portion 24. The fourth via hole penetrates the first gate insulating layer 411 and the second gate insulating layer 412, and is located on a side of the reset signal line ResetL away from the scan signal line GateL. The fifth via hole penetrates the first gate insulating layer 411, the second gate insulating layer 412 and the interlayer insulating layer 431, and is located between the reset signal line ResetL and the scan signal line GateL.

In some specific embodiments, an active layer of the threshold compensation transistor M4 includes a first electrode connection portion M4_1, a second electrode connection portion M4_2, and a channel portion located between the first electrode connection portion M4_1 and the second electrode connection portion M4_2. The first electrode connection portion M4_1 of the threshold compensation transistor M4 is connected to a first electrode M4_1' of the threshold compensation transistor M4 through the fifth via hole, and the first electrode M4_1' of the threshold compensation transistor M4 is connected to the conductive portion 24. Optionally, the second electrode connection portion M4_2 of the threshold compensation transistor M4 is connected to a second electrode of the threshold compensation transistor M4, the second electrode of the threshold compensation transistor M4 is connected to the second electrode of the driving transistor M3, and a gate electrode M4_3 of the threshold compensation transistor M4 and the scan signal line GateL are formed as an integral structure.

In the embodiments of the present disclosure, an orthographic projection of the reference signal line ViniL connected to the first pixel circuit 21a on the substrate 20 is referred to as a seventh projection, and an orthographic projection of the conductive structure 23 of the first pixel circuit 21a on the substrate 20 is referred to as an eighth projection; an orthographic projection of the reference signal line ViniL connected to the second pixel circuit 21b on the substrate 20 is referred to as a ninth projection, and an orthographic projection of the conductive structure 23 of the second pixel circuit 21b on the substrate 20 is referred to as a tenth projection. For the first pixel circuit 21a and the second pixel circuit 21b corresponding to the first pixel circuit 21a, the seventh projection is located on a side of the eighth projection away from the tenth projection, and the ninth projection is located on a side of the tenth projection away from the eighth projection.

In some specific embodiments, the light-emission control sub-circuit 203 includes the first light-emission control transistor M5 and the second light-emission control transistor M6. An active layer of the first light-emission control transistor M5 includes a first electrode connection portion M5_1, a second electrode connection portion M5_2, and a channel portion located between the first electrode connection portion M5_1 and the second electrode connection portion M5_2. An active layer of the second light-emission control transistor M6 includes a first electrode connection portion M6_1, a second electrode connection portion M6_2, and a channel portion located between the first electrode connection portion M6_1 and the second electrode connection portion M6_2. A gate electrode M5_3 of the first light-emission control transistor M5, a gate electrode M6_3 of the second light-emission control transistor M6 and the light-emission control line EML are formed as an integral structure. The first electrode connection portion M5_1 of the first light-emission control transistor M5 is connected to a first electrode M5_1' of the light-emission control transistor M5 through a sixth via hole, and the first electrode M5_1' of the light-emission control transistor M5 is connected to the first power line VDDL. Optionally, the second electrode connection portion M5_2 of the first light-emission control transistor M5 is connected to a second electrode of the first light-emission control transistor M5 through a via hole, and the second electrode of the first light-emission control transistor M5 is connected to the driving sub-circuit 202. Optionally, the first electrode connection part M6_1 of the second light-emission control transistor M6 is connected to a first electrode of the second light-emission control transistor M6 through a via hole, and the first electrode of the second light-emission control transistor M6 is connected to the driving sub-circuit 202. Optionally, the second electrode connection portion M6_2 of the second light-emission control transistor M6 is connected to a second electrode of the second light-emission control transistor M6 through a via hole, and the second electrode of the second light-emission control transistor M6 is connected to the conductive structure 23 located in a seventh via hole. The sixth via hole penetrates the first gate insulating layer and the interlayer insulating layer 431, the seventh via hole penetrates the insulating layer, and the sixth via hole and the seventh via hole are located on a side of the light-emission control line EML away from the scan signal line GateL.

It should be noted that the second pixel circuit on the left side in FIG. 7 to FIG. 9d is symmetrically arranged with the second pixel circuit on the right side (that is, the second pixel circuit described above) with respect to the first power line VDDL, and a structure thereof may be obtained according to the second pixel circuit on the right side, which will not be described in detail here.

In some specific embodiments, the display substrate further includes a pixel defining layer arranged on a side of the second pixel circuit 21b away from the substrate 20. More specifically, the pixel defining layer is arranged on a side of the planarization layer 38 of the second pixel circuit 21b away from the substrate 20. In the display region AA, the pixel defining layer may include an opening in at least one sub-pixel. A light emitting layer is filled in the opening, the first electrode 22a is arranged on a side of the light emitting layer close to the substrate 20 and is connected to the conductive structure 23, and the second electrode is arranged on a side of the light emitting layer away from the substrate 20.

Figure 11A:
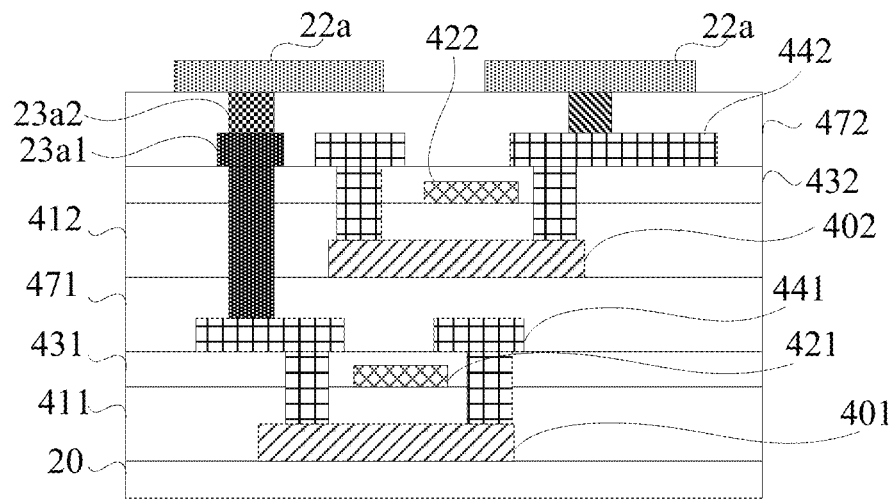
FIG. 11a to FIG. 11b schematically show schematic diagrams of an arrangement solution of a conductive structure provided according to embodiments of the present disclosure.
Figure 11B:
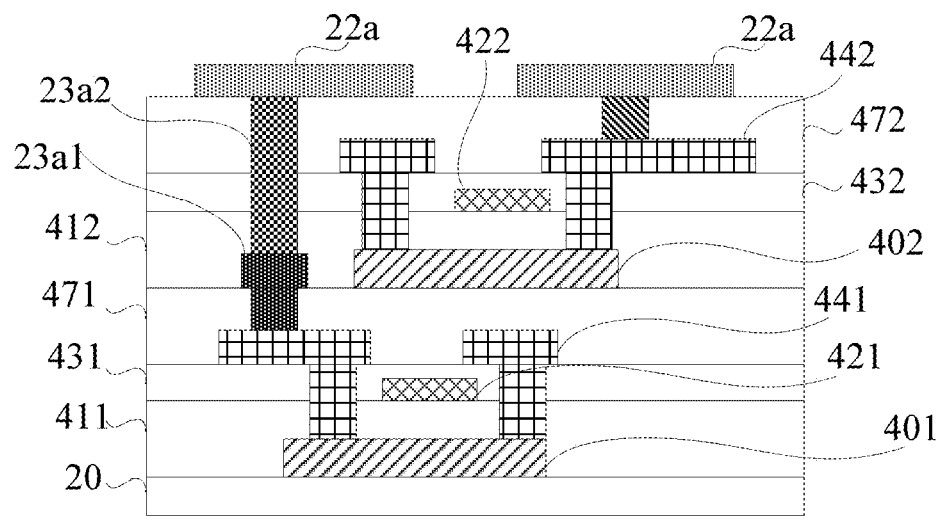

FIG. 11a to FIG. 11b schematically show schematic diagrams of an arrangement solution of the conductive structure provided according to the embodiments of the present disclosure. For the sake of clarity, in FIG. 11a to FIG. 11b, the semiconductor layer, the first gate insulating layer, the first gate layer, the interlayer insulating layer, the first metal layer, the passivation layer and the conductive structure corresponding to the first pixel circuit 21a are referred to as the semiconductor layer 401, the first gate insulating layer 411, the first gate layer 421, the interlayer insulating layer 431, the first metal layer 441, the passivation layer 471, and the conductive structure 23a, respectively; the semiconductor layer, the first gate insulating layer, the first gate layer, the interlayer insulating layer, the first metal layer, the second gate layer, the interlayer dielectric layer, the passivation layer and the conductive structure corresponding to the second pixel circuit 21b are referred to as the semiconductor layer 402, the first gate insulating layer 412, the first gate layer 422, the interlayer insulating layer 431, the first metal layer 442, the second gate layer 422, the interlayer dielectric layer 432, the passivation layer 472, and the conductive structure 23b, respectively. With reference to FIG. 11a and FIG. 11b, in some specific embodiments, the conductive structure 23a in the first pixel circuit 21a includes a first connection portion 23a1 and a second connection portion 23a2 on a side of the first connection portion 23a1 away from the substrate 20, and the first connection portion 23a1 is connected to the light-emission control sub-circuit 203. For example, the first connection portion 23a1 is connected to the second electrode of the second light-emission control transistor M6 in the light-emission control sub-circuit 203. The second connection portion 23a2 is connected to the light emitting device 22. For example, the second connection portion 232 is connected to the first electrode 22a of the light emitting device 22.

As shown in FIG. 11a, the first connection portion 23a1 is arranged in the same layer as the first metal layer 442 in the second pixel circuit 21b. That is, the first connection portion 23a1 and the first metal layer 442 in the second pixel circuit 21b are formed using the same film forming process.

As shown in FIG. 11b, the first connection portion 23a1 is arranged in the same layer as the semiconductor layer 402 in the second pixel circuit 21b. That is, the first connection portion 23a1 and the semiconductor layer 402 in the second pixel circuit 21b are formed using the same film forming process.

In some specific embodiments, after the passivation layer 472 of the second pixel circuit 21b is formed, a connection hole exposing the first connection portion 23a1 may be formed on the passivation layer 472. For example, when the first connection portion 23a1 is arranged in the same layer as the first metal layer 442 in the second pixel circuit 21b, the connection hole may penetrate the passivation layer 472 of the second pixel circuit 21b, so as to expose the first connection portion 23a1; when the first connection portion 23a1 is arranged in the same layer as the semiconductor layer 402 in the second pixel circuit 21b, the connection hole may penetrate the passivation layer 472, the interlayer dielectric layer 432 and the first gate insulating layer 412 of the second pixel circuit 21b, so as to expose the first connection portion 23a1. After the connection hole is formed, the second connection portion 23a2 electrically connected to the first connection portion 23a1 may be formed in the connection hole simultaneously with the formation of the first electrode 22a.

In this way, the conductive structure 23a in the first pixel circuit 21a may be prepared by a two-step process. Compared with preparing the conductive structure by a one-step process, preparing the conductive structure 23a by the two-step process is less difficult, which is conducive to a production of the product.

In the embodiments of the present disclosure, when the first connection portion 23a1 and the semiconductor layer 402 in the second pixel circuit 21b are formed by the same film forming process, the preparation process may include: forming a semiconductor material layer; doping a conductive material into portions of the semiconductor material layer for forming the source and drain electrodes of the transistor and for forming the first connection portion 23a1, so as to make the semiconductor material conductive to achieve a conductive function.

Figure 12A:
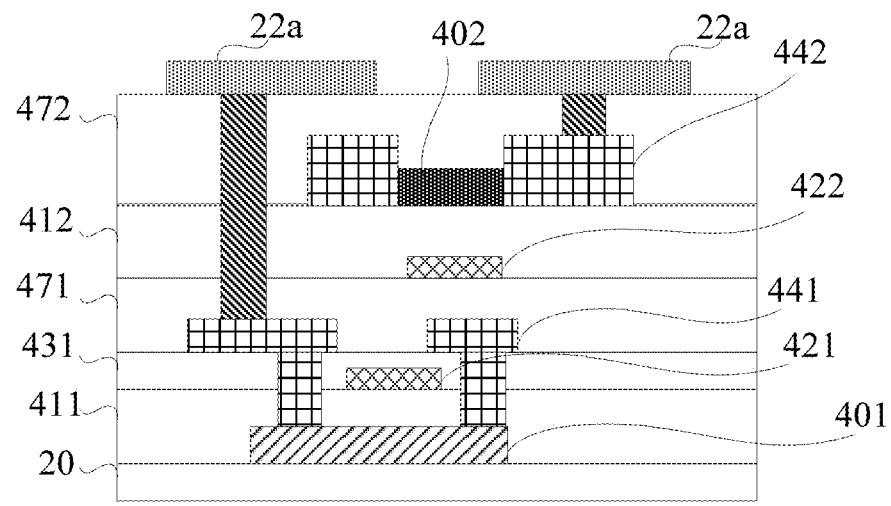
FIG. 12a to FIG. 12c schematically show second schematic diagrams of a stacked structure of a first pixel circuit and a second pixel circuit provided according to embodiments of the present disclosure.
Figure 12B:
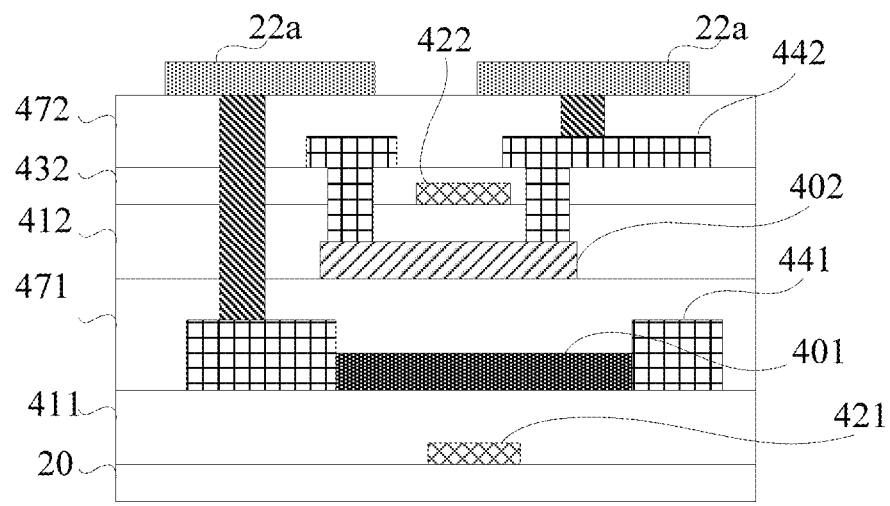
Figure 12C:
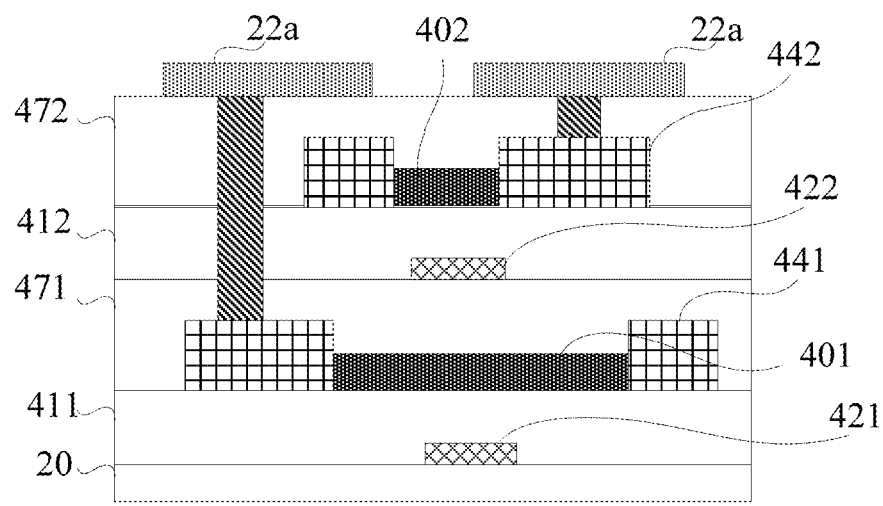

FIG. 12a to FIG. 12c schematically show schematic diagrams of a stacked structure of the first pixel circuit and the second pixel circuit provided according to some other embodiments of the present disclosure. As shown in FIG. 12a, in some other specific embodiments, the transistors in the first pixel circuit 21a may be LTPS thin film transistors, and the transistors in the second pixel circuit 21b may be oxide thin film transistors. Alternatively, as shown in FIG. 12b, the transistors in the first pixel circuit 21a may be oxide thin film transistors, and the transistors in the second pixel circuit 21b may be LTPS thin film transistors. Alternatively, as shown in FIG. 12c, the transistors in the first pixel circuit 21a and the transistors in the second pixel circuit 21b may be oxide thin film transistors. In addition to the above-mentioned transistors, α-Si transistors, IGZO transistors, or a combination of any of the above-mentioned transistors may also be used in the pixel circuit 21, which may be determined according to actual needs and is not limited here.

It should be noted that no matter which transistor mentioned above is used in the pixel circuit 21, it only involves a change of a structure of the transistor itself, and an overall structure of the pixel circuit 21 (such as positions and connection relationships of the transistors on the plane) may be the same as the aforementioned embodiments, which will not be described in detail here.

In some specific embodiments, the display substrate may be applied to various current display fields, which may be specifically determined according to actual needs and is not limited here. For example, the display substrate of the embodiments of the present disclosure may be applied in a field of a virtual reality (VR) display and a field of an augmented reality (AR) display.

The present disclosure further provides a display panel having the display substrate as described above. The display panel of the present disclosure may be an organic light emitting diode (OLED) display panel, or a quantum dot light emitting diode (QLED) display panel, or a mini light emitting diode (mini LED) display panel, or a micro light emitting diode (micro LED) display panel, etc.

In the embodiments of the present disclosure, the display panel may further include an encapsulation layer covering the display substrate. For example, the encapsulation layer may include a first encapsulation sub-layer, a second encapsulation sub-layer and a third encapsulation sub-layer sequentially arranged in a direction away from the substrate. For example, the first encapsulation sub-layer and the third encapsulation sub-layer may be formed of an inorganic material, and the second encapsulation sub-layer may be formed of an organic material.

The encapsulation layer TFE may block an intrusion of water vapor and oxygen into an interior of the display substrate, thereby forming a protection for the display substrate.

The present disclosure further provides a display device including the display panel as described above.

In other embodiments of the present disclosure, examples of the display device include a tablet personal computer (PC), a smart phone, a personal digital assistant (PDA), a portable multimedia player, a game console, or a wrist watch-type electronic device, etc. However, the embodiments of the present disclosure are not intended to limit the type of the display device. In some exemplary embodiments, the display device may be used not only in a large electronic device such as a television (TV) or an external billboard, but also in a medium or small electronic device such as a PC, a laptop computer, a vehicle navigation device, a camera or the like.

Those skilled in the art may understand that various embodiments of the present disclosure and/or features described in the claims may be combined in various ways, even if such combinations are not explicitly described in the present disclosure. In particular, the features described in the various embodiments and/or the claims of the present disclosure may be combined in various ways without departing from the spirit and teachings of the present disclosure. All these combinations fall within the scope of the present disclosure.

The embodiments of the present disclosure have been described above. However, these embodiments are for illustrative purposes only, and are not intended to limit the scope of the present disclosure. Although various embodiments have been described separately above, this does not mean that measures in the various embodiments may not be used in combination advantageously. The scope of the present disclosure is defined by the appended claims and their equivalents. Those skilled in the art may make various substitutions and modifications without departing from the scope of the present disclosure, and these substitutions and modifications should all fall within the scope of the present disclosure.

What is claimed is:

1. A display substrate, comprising:
   a substrate; and
   a plurality of pixel circuits and a plurality of light emitting devices provided on the substrate, wherein the plurality of pixel circuits are arranged in an array, and at least one pixel circuit is connected to a corresponding light emitting device through a conductive structure,
   wherein at least some of pixel circuits in at least one column comprise at least one first pixel circuit and at least one second pixel circuit forming at least one group, and each group of the at least one group is formed of a first pixel circuit and a second pixel circuit corresponding to the first pixel circuit,
   wherein in each group formed of the first pixel circuit and the second pixel circuit, the second pixel circuit is arranged on a side of the first pixel circuit away from the substrate, an orthographic projection of the second pixel circuit on the substrate partially overlaps with an orthographic projection of the first pixel circuit on the substrate, wherein an overlapping portion between the orthographic projection of the second pixel circuit on the substrate and the orthographic projection of the first pixel circuit on the substrate defines a first pattern, and an orthographic projection of a conductive structure of the first pixel circuit on the substrate, the overlapping portion defining the first pattern, and an orthographic projection of a conductive structure of the second pixel circuit on the substrate are sequentially arranged in a first direction.

2. The display substrate according to claim 1, wherein
   the at least one pixel circuit comprises an input sub-circuit, a driving sub-circuit and a light-emission control sub-circuit, the input sub-circuit and the light-emission control sub-circuit are connected to the driving sub-circuit, the input sub-circuit is further connected to a scan signal line and a data voltage signal line, and the light-emission control sub-circuit is further connected to a first power line, a light-emission control line and the conductive structure;
   the input sub-circuit is configured to transmit a data voltage signal of the data voltage signal line to the driving sub-circuit in response to a control of the scan signal line;
   the light-emission control sub-circuit is configured to transmit a first voltage signal of the first power line to the driving sub-circuit and transmit a driving current provided by the driving sub-circuit to the conductive structure, in response to a control of the light-emission control line; and
   the driving sub-circuit is configured to provide the driving current according to the data voltage signal and the first voltage signal; and
   wherein the driving sub-circuit and the light-emission control sub-circuit of at least one first pixel circuit are sequentially arranged in the first direction; the driving sub-circuit and the light-emission control sub-circuit of at least one second pixel circuit are sequentially arranged in a second direction; and the first direction is the same as an extension direction of the data voltage signal line, and the second direction is opposite to the first direction.

3. The display substrate according to claim 2, wherein the at least one pixel circuit further comprises a reset sub-circuit, wherein the reset sub-circuit is connected to the driving sub-circuit, a reference signal line and a reset signal line;
   wherein the reset sub-circuit is configured to transmit a reference signal of the reference signal line to the driving sub-circuit in response to a control of the reset signal line; and
   wherein the reset sub-circuit of the at least one pixel circuit is located on a side of the driving sub-circuit away from the light-emission control sub-circuit.

4. The display substrate according to claim 3, wherein the at least one pixel circuit comprises a semiconductor layer, a first gate insulating layer, a first gate layer, an interlayer insulating layer and a first metal layer sequentially arranged in a direction away from the substrate; and the reset signal line, the scan signal line and the light-emission control line are located in the first gate layer; and
    wherein the reset signal line, the scan signal line and the light-emission control line connected to the first pixel circuit are sequentially arranged in the first direction, and the reset signal line, the scan signal line and the light-emission control line connected to the second pixel circuit are sequentially arranged in the second direction.

5. The display substrate according to claim 4, wherein the conductive structure in the first pixel circuit comprises a first connection portion and a second connection portion located on a side of the first connection portion away from the substrate, the first connection portion is connected to the light-emission control sub-circuit, and the second connection portion is connected to the light emitting device; and
    wherein the first connection portion is arranged in the same layer as the first metal layer in the second pixel circuit, or the first connection portion is arranged in the same layer as the semiconductor layer in the second pixel circuit.

6. The display substrate according to claim 4, wherein the data voltage signal line is located in the first metal layer, the input sub-circuit comprises an input transistor, a first electrode connection portion of the input transistor is located in the semiconductor layer, a gate electrode of the input transistor is formed as an integral structure with the scan signal line, the first electrode connection portion of the input transistor is connected to a first electrode of the input transistor through a first via hole, the first electrode of the input transistor is connected to the data voltage signal line, and a second electrode of the input transistor is connected to the driving sub-circuit; and
    wherein the first via hole penetrates the first gate insulating layer and the interlayer insulating layer, and the first via hole is located between the scan signal line and the reset signal line.

7. The display substrate according to claim 4, wherein the driving sub-circuit comprises a driving transistor and a storage capacitor;
    wherein a gate electrode of the driving transistor is connected to the reset sub-circuit and a first plate of the storage capacitor, a first electrode of the driving transistor is connected to the input sub-circuit, a second electrode of the driving transistor is connected to the light-emission control sub-circuit, and a second plate of the storage capacitor is connected to the light-emission control sub-circuit and the first power line; and
    wherein the driving transistor and the storage capacitor are located between the light-emission control line and the scan signal line.

8. The display substrate according to claim 7, wherein the at least one pixel circuit further comprises a second gate layer provided on a side of the first gate layer and the interlayer insulating layer away from the substrate, and a second gate insulating layer is provided between the first gate layer and the second gate layer;
    wherein the first plate of the storage capacitor is formed as an integral structure with the gate electrode of the driving transistor, and the second plate of the storage capacitor is located in the second gate layer; and
    wherein the second plate of the storage capacitor is connected to the first power line through a second via hole penetrating the interlayer insulating layer.

9. The display substrate according to claim 7, wherein the first plate of the storage capacitor is connected to the reset sub-circuit through a conductive portion located in the first metal layer; and
    wherein the first plate of the storage capacitor is connected to the conductive portion through a third via hole, wherein the third via hole penetrates the second gate insulating layer, the second gate layer and the interlayer insulating layer.

10. The display substrate according to claim 9, wherein the reference signal line is located in the second gate layer, the reset sub-circuit comprises a reset transistor, and a second electrode connection portion of the reset transistor is located in the semiconductor layer;
    wherein a gate electrode of the reset transistor is formed as an integral structure with the reset signal line, a second electrode connection portion of the reset transistor is connected to a second electrode of the reset transistor through a fourth via hole, the second electrode of the reset transistor is connected to the reference signal line, a first electrode connection portion of the reset transistor is connected to a first electrode of the reset transistor through a fifth via hole, and the first electrode of the reset transistor is connected to the conductive portion; and
    wherein the fourth via hole penetrates the first gate insulating layer and the second gate insulating layer and is located on a side of the reset signal line away from the scan signal line, and the fifth via hole penetrates the first gate insulating layer, the second gate insulating layer and the interlayer insulating layer and is located between the reset signal line and the scan signal line.

11. The display substrate according to claim 4, wherein the at least one pixel circuit further comprises a planarization layer on a side of the first metal layer away from the substrate, the light-emission control sub-circuit comprises a first light-emission control transistor and a second light-emission control transistor, and a first electrode connection portion of the first light-emission control transistor is located in the semiconductor layer;
    wherein a gate electrode of the first light-emission control transistor, a gate electrode of the second light-emission control transistor and the light-emission control line are formed as an integral structure, the first electrode connection portion of the first light-emission control transistor is connected to a first electrode of the first light-emission control transistor through a sixth via hole, the first electrode of the first light-emission control transistor is connected to the first power line, and a second electrode of the first light-emission control transistor is connected to the driving sub-circuit; and a first electrode of the second light-emission control transistor is connected to the driving sub-circuit, a second electrode of the second light-emission control transistor is connected to the conductive structure, and the conductive structure is located in a seventh via hole; and
    wherein the sixth via hole penetrates through the gate insulating layer and the interlayer insulating layer, the seventh via hole penetrates through the planarization layer, and the sixth via hole and the seventh via hole are located on a side of the light-emission control line away from the scan signal line.

12. The display substrate according to claim 2, wherein the input sub-circuit of the at least one pixel circuit is located on a side of the light-emission control sub-circuit close to the driving sub-circuit.

13. The display substrate according to claim 2, wherein the driving sub-circuit comprises a driving transistor, the at least one pixel circuit further comprises a threshold compensation sub-circuit, the threshold compensation sub-circuit is connected to the scan signal line, a gate electrode and a second electrode of the driving transistor, wherein the threshold compensation sub-circuit is configured to perform a threshold compensation on the driving transistor in response to the control of the scan signal line; and wherein the threshold compensation sub-circuit is located on a side of the light-emission control sub-circuit close to the driving sub-circuit.

14. The display substrate according to claim 2, wherein the first power line extends in the first direction;

wherein a plurality of first pixel circuits arranged in a third direction are divided into a plurality of groups, at least one group comprises a plurality of first pixel circuits, the plurality of first pixel circuits in the at least one group share one first power line, and the plurality of first pixel circuits in the at least one group are symmetrically arranged with respect to the first power line, wherein the third direction intersects with the first direction; and wherein a plurality of second pixel circuits arranged in the third direction are divided into a plurality of groups, each group comprises a plurality of second pixel circuits, the plurality of second pixel circuits in at least one group share one first power line, and the plurality of second pixel circuits in the at least one group are symmetrically arranged with respect to the first power line.

15. The display substrate according to claim 1, wherein the plurality of light emitting devices comprise a plurality of colors of light emitting devices, wherein for at least one color of the plurality of colors, more than one light emitting device corresponds to each color of the at least one color, and at least some of the more than one light emitting device of the each color are connected to the at least one first pixel circuit and at least some of the more than one light emitting device of the each color are connected to the at least one second pixel circuit.

16. The display substrate according to claim 1, wherein a plurality of pixel units are formed by the plurality of light emitting devices, and at least one pixel unit comprises light emitting devices of more than one color; and wherein in the at least one pixel unit, at least some of the light emitting devices of more than one color are connected to the at least one first pixel circuit, and at least some of the light emitting devices of more than one color are connected to the at least one second pixel circuit.

17. The display substrate according to claim 16, wherein at least one pixel unit comprises a light emitting device of a first color, a light emitting device of a second color, and a plurality of light emitting devices of a third color, and the plurality of light emitting devices of the third color comprise a first light emitting device and a second light emitting device; and wherein in the at least one pixel unit, the light emitting device of the first color is connected to one of the at least one first pixel circuit and the at least one second pixel circuit, and the light emitting device of the second color is connected to a remaining one of the at least one first pixel circuit and the at least one second pixel circuit; and the first light emitting device is connected to one of the at least one first pixel circuit and the at least one second pixel circuit, and the second light emitting device is connected to a remaining one of the at least one first pixel circuit and the at least one second pixel circuit.

18. The display substrate according to claim 17, wherein the plurality of pixel units are divided into a plurality of columns;

wherein in at least one pixel unit in a $(2n-1)^{th}$ column of pixel units, the light emitting device of the first color is connected to a respective one of the at least one first pixel circuit, the light emitting device of the second color is connected to a respective one of the at least one second pixel circuit, the first light emitting device is connected to a respective one of the at least one first pixel circuit, and the second light emitting device is connected to a respective one of the at least one second pixel circuit;

wherein in at least one pixel unit in a $2n^{th}$ column of pixel units, the light emitting device of the first color is connected to the second pixel circuit, the light emitting device of the second color is connected to the first pixel circuit, the first light emitting device is connected to the second pixel circuit, and the second light emitting device is connected to the first pixel circuit; and wherein n is a positive integer.

19. A display panel comprising the display substrate according to claim 1.

20. A display device comprising the display panel according to claim 19.

* * * * *